United States Patent
Oganesian et al.

(10) Patent No.: US 9,190,443 B2
(45) Date of Patent: Nov. 17, 2015

(54) LOW PROFILE IMAGE SENSOR

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: OPTIZ INC., Palo Alto, CA (US)

( * ) Notice: Subject to any disclaimer, the term of this patent is extended or adjusted under 35 U.S.C. 154(b) by 0 days.

(21) Appl. No.: 14/200,146

(22) Filed: Mar. 7, 2014

(65) Prior Publication Data

US 2014/0264691 A1    Sep. 18, 2014

Related U.S. Application Data

(60) Provisional application No. 61/778,267, filed on Mar. 12, 2013.

(51) Int. Cl.
*H01L 27/146* (2006.01)

(52) U.S. Cl.
CPC .... *H01L 27/14636* (2013.01); *H01L 27/14618* (2013.01); *H01L 27/14625* (2013.01); *H01L 27/14627* (2013.01); *H01L 27/14632* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,777,767 B2 | 8/2004 | Badehi | |
| 6,972,480 B2 | 12/2005 | Zilber et al. | |
| 7,033,664 B2 | 4/2006 | Zilber et al. | |
| 7,157,742 B2 | 1/2007 | Badehi | |
| 7,192,796 B2 | 3/2007 | Zilber et al. | |
| 7,265,440 B2 | 9/2007 | Zilber et al. | |
| 7,456,901 B2 | 11/2008 | Jeong et al. | |
| 7,495,341 B2 | 2/2009 | Zilber et al. | |
| 7,569,409 B2 | 8/2009 | Lin et al. | |
| 7,589,422 B2 | 9/2009 | Lee et al. | |
| 7,642,629 B2 | 1/2010 | Zilber et al. | |
| 7,664,390 B2 | 2/2010 | Cho et al. | |
| 7,859,033 B2 | 12/2010 | Brady | |

(Continued)

FOREIGN PATENT DOCUMENTS

JP    2004-165191    6/2004
KR    10-2013-0010847    1/2013

OTHER PUBLICATIONS

U.S. Appl. No. 13/157,193, filed Jun. 9, 2011, Oganesian, Vage.

(Continued)

*Primary Examiner* — Bilkis Jahan
*Assistant Examiner* — Kevin Quinto
(74) *Attorney, Agent, or Firm* — DLA Piper LLP (US)

(57) ABSTRACT

A sensor package comprising a host substrate with opposing first and second surfaces, an aperture extending therethrough, circuit layers, and first contact pads. A second substrate at least partially in the aperture has opposing first and second surfaces, a plurality of photo detectors, second contact pads at the second substrate first surface and electrically coupled to the photo detectors, and trenches formed into the second substrate first surface, conductive traces extending from the second contact pads and into the trenches. A third substrate has a first surface mounted to the first surface of the second substrate. The third substrate includes a cavity formed into its first surface and positioned over the photo detectors. Electrical connectors connect the first contact pads and conductive traces. A lens module is mounted to the host substrate for focusing light through the third substrate and onto the photo detectors.

14 Claims, 24 Drawing Sheets

(56) References Cited

U.S. PATENT DOCUMENTS

| | | |
|---|---|---|
| 2004/0251525 A1 | 12/2004 | Zilber |
| 2005/0104179 A1 | 5/2005 | Zilber |
| 2005/0205977 A1 | 9/2005 | Zilber |
| 2007/0138498 A1 | 6/2007 | Zilber |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0246136 A1 | 10/2008 | Haba et al. |
| 2008/0265350 A1 | 10/2008 | Wu et al. |
| 2009/0115047 A1 | 5/2009 | Haba |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0187007 A1 | 8/2011 | Haba |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0043635 A1 | 2/2012 | Yang |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2014/0070349 A1* | 3/2014 | Oganesian .................... 257/432 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
Korean Office Action dated Apr. 17, 2015 corresponding to the related Korean Patent Application No. 10-2014-0028499. (English and Korean translations).

* cited by examiner

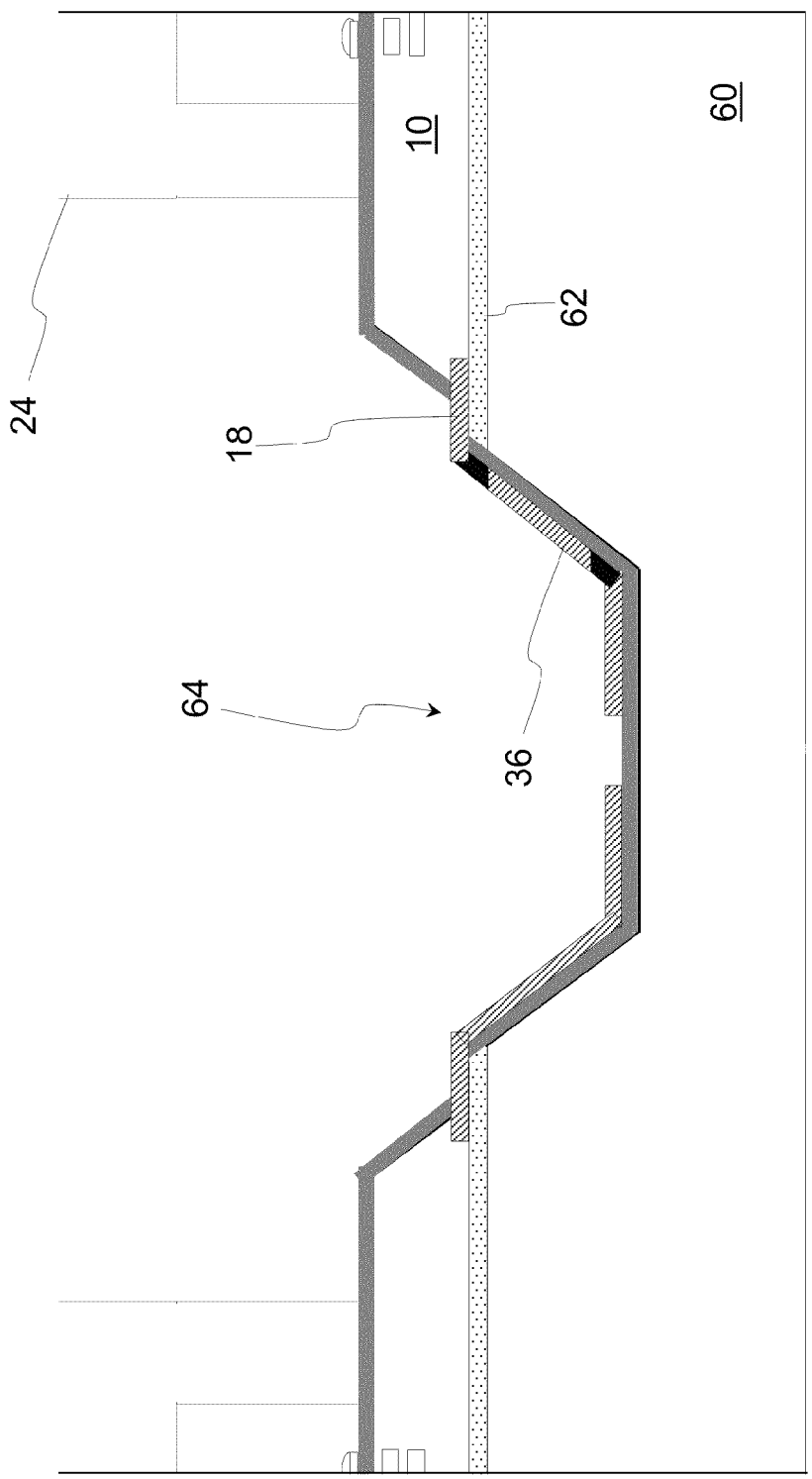

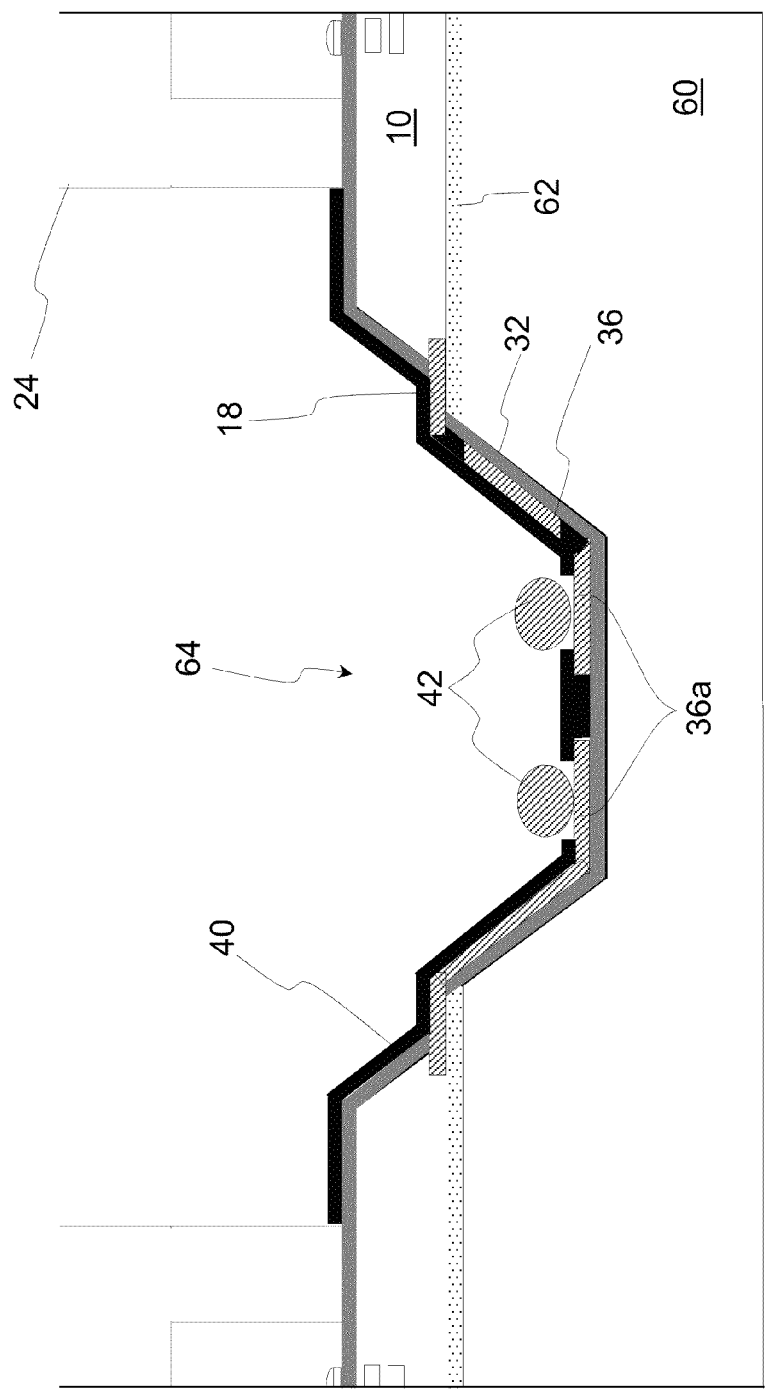

LOW PROFILE IMAGE SENSOR

RELATED APPLICATIONS

This application claims the benefit of U.S. Provisional Application No. 61/778,267, filed Mar. 12, 2013, and which is incorporated herein by reference.

FIELD OF THE INVENTION

The present invention relates to packaging of microelectronic devices, and more particularly to a packaging of optical semiconductor devices.

BACKGROUND OF THE INVENTION

The trend for semiconductor devices is smaller integrated circuit (IC) devices (also referred to as chips), packaged in smaller packages (which protect the chip while providing off chip signaling connectivity). One example are image sensors, which are IC devices that include photo-detectors which transform incident light into electrical signals (that accurately reflect the intensity and color information of the incident light with good spatial resolution).

There are different driving forces behind the development of wafer level packaging solutions for image sensors. For example, reduced form factor (i.e. increased density for achieving the highest capacity/volume ratio) overcomes space limitations and enables smaller camera module solutions. Increased electrical performance can be achieved with shorter interconnect lengths, which improves electrical performance and thus device speed, and which strongly reduces chip power consumption.

Presently, chip-on-board (COB—where the bare chip is mounted directly on a printed circuit board) and Shellcase Wafer Level CSP (where the wafer is laminated between two sheets of glass) are the dominant packaging and assembly processes used to build image sensor modules (e.g. for mobile device cameras, optical mice, etc.). However, as higher pixel image sensors are used, COB and Shellcase WLCSP assembly becomes increasingly difficult due to assembly limitations, size limitations (the demand is for lower profile devices), yield problems and the up-front capital investment for packaging 8 and 12 inch image sensor wafers. Additionally, standard WLP packages are fan-in packages, in which chip area is equal to the package area, thus limiting the number of I/O connections.

There is a need for an improved package and packaging technique that provides a low profile packaging solution that is cost effective and uses a simplified structure.

BRIEF SUMMARY OF THE INVENTION

An image sensor package comprising a host substrate assembly and a sensor chip mounted to the host substrate assembly. The host substrate assembly includes a first substrate with opposing first and second surfaces, an aperture extending through the first substrate between the first and second surfaces, one or more circuit layers, and a plurality of first contact pads electrically coupled to the one or more circuit layers. The sensor chip is disposed at least partially in the aperture and includes a second substrate with opposing first and second surfaces, a plurality of photo detectors formed on or in the second substrate, a plurality of second contact pads formed at the first surface of the second substrate which are electrically coupled to the photo detectors, one or more trenches formed into the first surface of the second substrate, a plurality of conductive traces each extending from one of the second contact pads and into the one or more trenches, and a third substrate having a first surface mounted to the first surface of the second substrate, wherein the third substrate includes a cavity formed into the first surface of the third substrate that is positioned over the photo detectors. Electrical connectors are each electrically connecting one of the first contact pads and one of the plurality of conductive traces. A lens module is mounted to the host substrate assembly, wherein the lens module includes one or more lenses disposed for focusing light through the third substrate and onto the photo detectors.

In another aspect, an image sensor package comprises a host substrate assembly and a sensor chip mounted to the host substrate assembly. The host substrate assembly includes a first substrate with opposing first and second surfaces, an aperture extending through the first substrate between the first and second surfaces, one or more circuit layers, and a plurality of first contact pads electrically coupled to the one or more circuit layers. The a sensor chip is disposed at least partially in the aperture and includes a second substrate with opposing first and second surfaces, a plurality of photo detectors formed on or in the second substrate, a plurality of second contact pads formed at the second surface of the second substrate which are electrically coupled to the photo detectors, one or more trenches formed into the first surface of the second substrate and exposing the second contact pads, and a third substrate having a first surface mounted to the first surface of the second substrate, wherein the third substrate includes a cavity formed into the first surface of the third substrate that is positioned over the photo detectors. A fourth substrate includes opposing first and second surfaces, wherein the first surface of the fourth substrate is mounted to the second surface of the second substrate, and wherein the fourth substrate includes one or more trenches formed into the first surface of the fourth substrate. A plurality of conductive traces each extends from one of the second contact pads and into the one or more trenches of the fourth substrate. Electrical connectors are each electrically connecting one of the first contact pads and one of the plurality of conductive traces. A lens module is mounted to the host substrate assembly, wherein the lens module includes one or more lenses disposed for focusing light through the third substrate and onto the photo detectors.

Other objects and features of the present invention will become apparent by a review of the specification, claims and appended figures.

BRIEF DESCRIPTION OF THE DRAWINGS

FIGS. 2A-2H are cross sectional side views showing in sequence the steps in forming an alternate embodiment the image sensor assembly.

DETAILED DESCRIPTION OF THE INVENTION

The present invention is a low profile, chip scale sensor module (e.g. for use in cameras) that incorporates a wafer level packaged image sensor, a host substrate with the imaging window, and an optics/camera lens module, which are assembled directly to a host substrate.

Figure 1A:
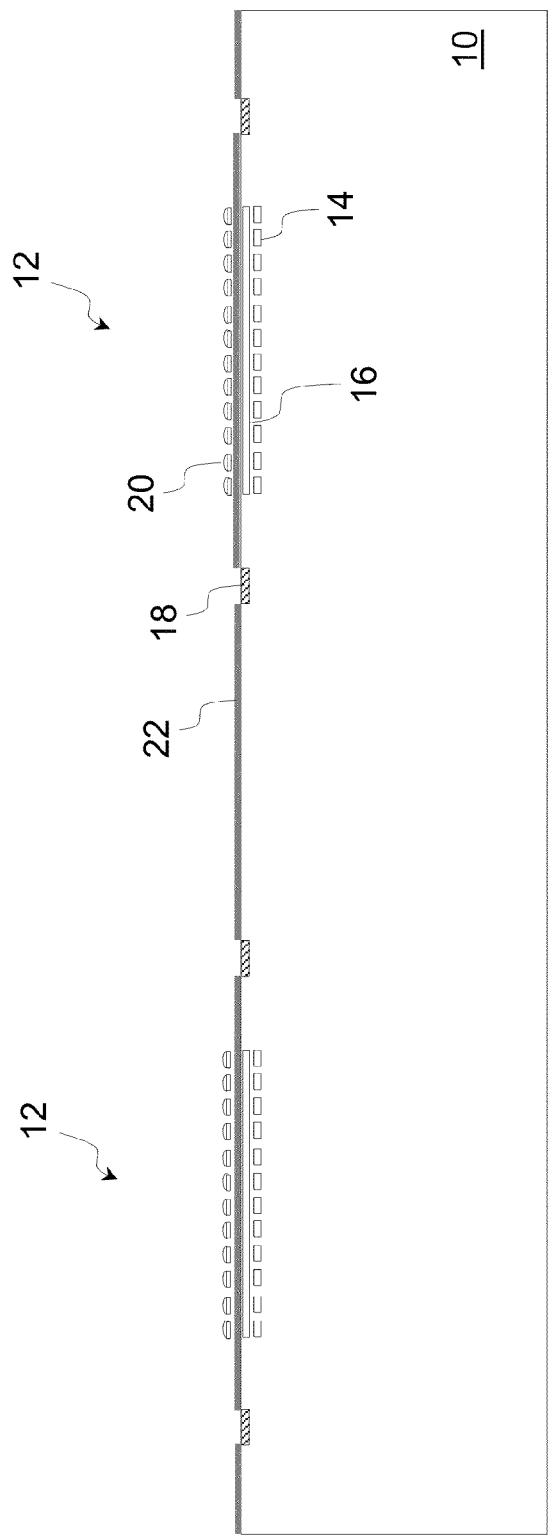
FIGS. 1A-1L are cross sectional side views showing in sequence the steps in forming the image sensor assembly.

FIGS. 1A-1M illustrate the formation of the packaged image sensor. The formation begins with a wafer 10 (silicon substrate) containing multiple image sensors 12 formed thereon, as illustrated in FIG. 1A. Each image sensor 12 includes a plurality of photo detectors 14, supporting circuitry 16, and contact pads 18. Photo detectors 14 are configured to detect and measure incident light. The contact pads 18 are electrically connected to the photo detectors 14 and/or their supporting circuitry 16 for providing off chip signaling. Each photo detector 14 converts light energy to a voltage signal. Additional circuitry may be included to amplify the voltage, and/or convert it to digital data. Color filters and/or microlenses 20 can be mounted over the photo detectors 14. Preferably, a passivation layer 22, such as silicon dioxide (oxide) or silicon nitride, is formed over the top surface of the substrate 10. Passivation layer 22 is formed so that it is transparent at least to the wavelengths of light for which the sensor will be used to detect. Sensors of this type are well known in the art, and not further described herein.

Figure 1B:
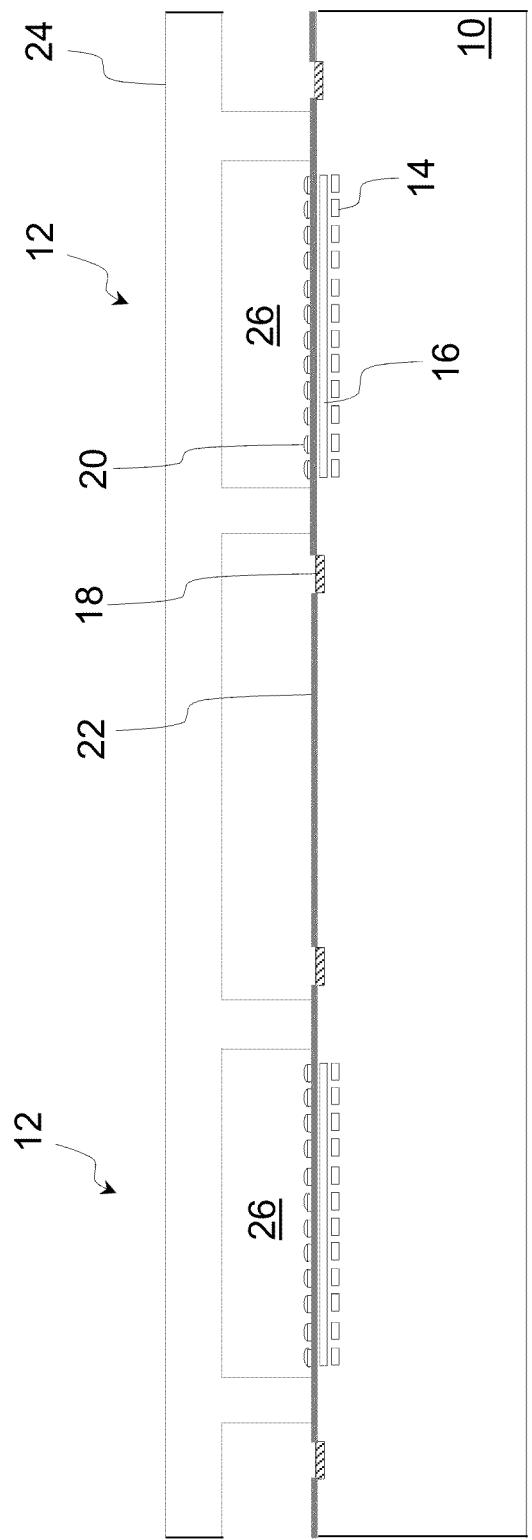

The active areas of each sensor 12 (i.e. those areas containing the photo detectors 14 and filters/lenses 20) are encapsulated by a protective and optically transparent substrate 24 mounted to the upper surface of substrate 10. A plurality of cavities 26 are formed into the bottom surface of the substrate 24 and aligned to the active areas of each sensor 12. Each cavity 26 is large enough to cover the entire active area of one of the sensors 12, but not the sensor's contact pads 18. The protective substrate 24 is bonded on the active side of the substrate 10 by epoxy, polymer, resin or any other appropriate bonding adhesive(s) and method(s). The optically transparent substrate 24 can be polymer, glass, a composite of glass and polymer or any other optically transparent material(s). Preferably, the substrate is glass. A preferred non-limiting example of substrate 24 may have a thickness of 50 to 1000 μm, and preferred height of the cavity space may be 5 to 500 μm. The silicon substrate 10 may be thinned by mechanical grinding, chemical mechanical polishing (CMP), wet etching, atmospheric downstream plasma (ADP), dry chemical etching (DCE), and/or a combination of aforementioned processes or any another appropriate silicon thinning method(s). The preferred thickness of the thinned silicon substrate 10 is 50 to 300 μm. The resulting structure is shown in FIG. 1B.

Figure 1C:
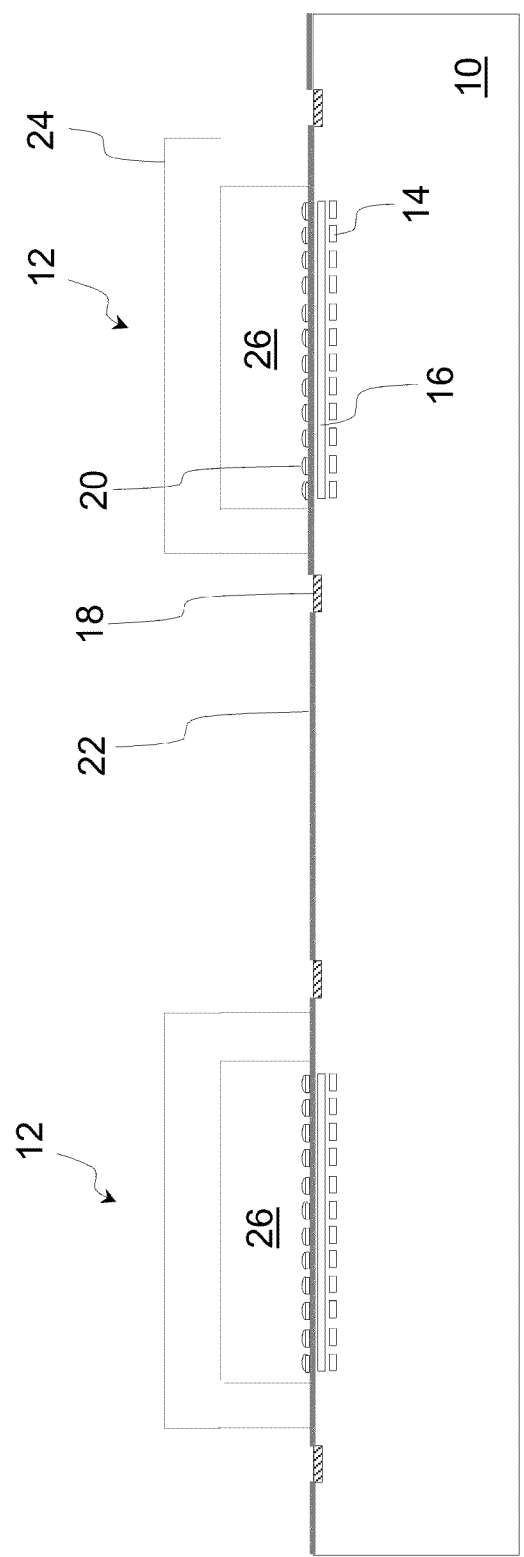

The portions of the protective substrate 24 between the active areas of sensors 12 can be removed using laser cutting equipment, mechanical sawing, a combination of aforementioned processes, and/or any other appropriate glass cutting method(s). Laser cutting is the preferred method. This process separates portions of substrate 24 that form cavities 26 (which will eventually be singulated into separate die), thus achieving protective cavity singulation. The resulting structure is shown in FIG. 1C. Preferably, each protective substrate 24 forms a seal with substrate 10 to protect the portion of substrate 10 over photo detectors 14 and microlenses/filters 20 (i.e. cavities 26 are sealed).

Figure 1D:
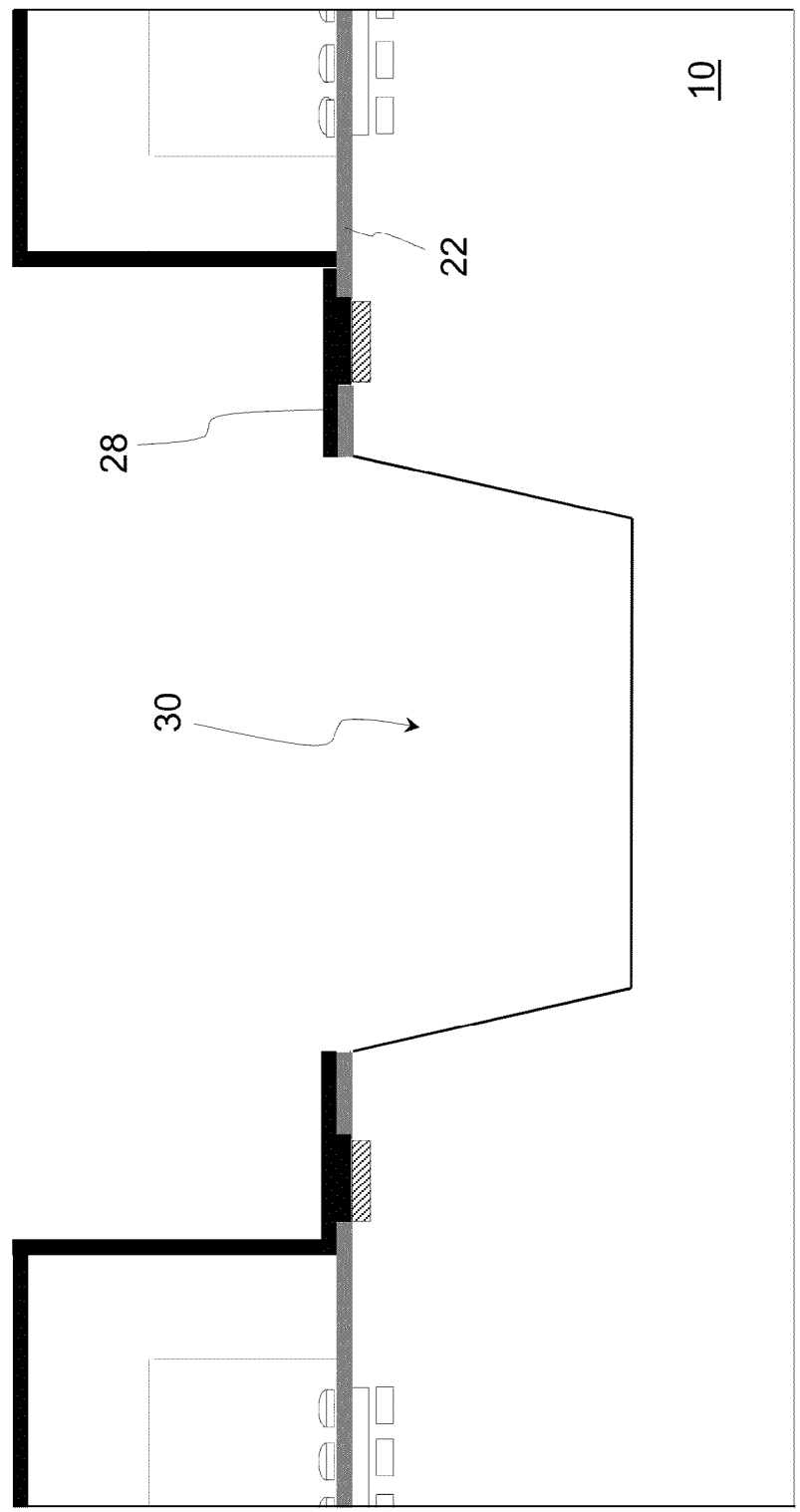

A layer of photoresist 28 is deposited over the structure. Photoresist deposition method can be spray coating or any another appropriate deposition method(s). Photoresist 28 is exposed and etched using appropriate photolithography processes that are well known in the art, where the photoresist is removed in the areas of the substrate 10 between sensors 12, thus exposing the passivation layer. The exposed passivation layer 22 is removed (e.g. by plasma etching), thus exposing the substrate 10. If passivation is silicon dioxide or nitride, then the etchant can be CF4, SF6 or any other appropriate etchant. A silicon etch is then performed to form trenches 30 into the exposed portions of substrate 10. The silicon etch can be an anisotropic dry etch using CF4, SF6 or any other appropriate etchant. A preferred depth of trenches 30 is in range of 25 to 150 μm, depending upon the final thickness of the substrate 10. The resulting structure is shown in FIG. 1D.

Figure 1E:
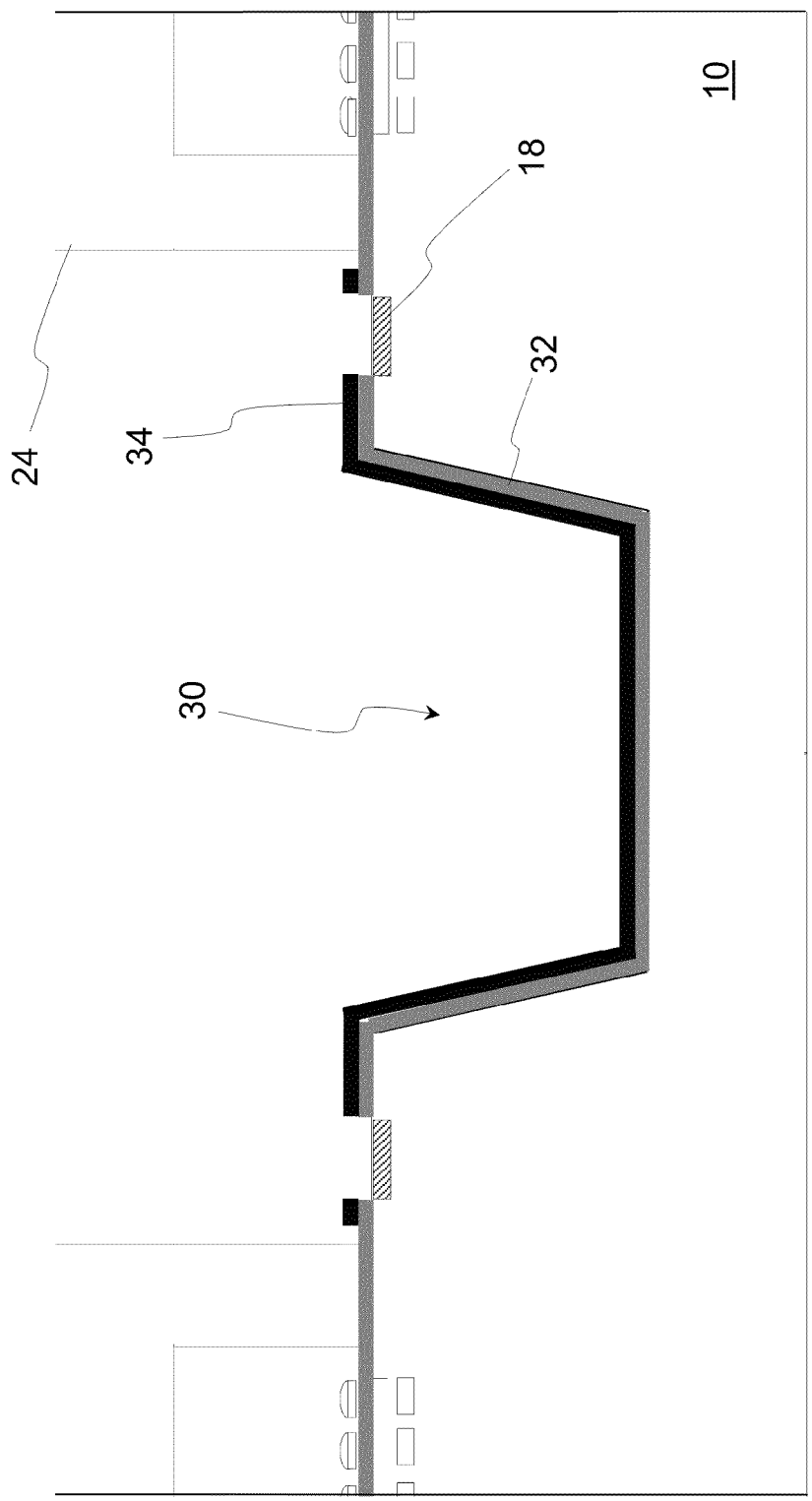

The photoresist 28 is stripped using acetone or any other chemical or plasma (e.g O2 plasma) photoresist stripping method that are well known in the art. A passivation layer 32 (e.g. silicon dioxide) is deposited over the structure, preferably with a thickness equal to or greater than 0.5 μm. Silicon dioxide deposition can be performed by Physical Vapor Deposition (PVD) or any another appropriate deposition method(s). A layer of photoresist 34 is deposited over the structure (e.g. by spray coating or any another appropriate deposition method(s)). Photoresist 34 is exposed and etched using appropriate photolithography processes that are well known in the art, whereby the photo resist 34 is removed from the protective substrate 24 and portions over contact pads 18, exposing portions of passivation layer 32 in those areas. An etch is performed to remove the exposed portions of passivation layer 32 (on protective substrate 24 and over contact pads 18). The resulting structure is shown in FIG. 1E.

Figure 1F:
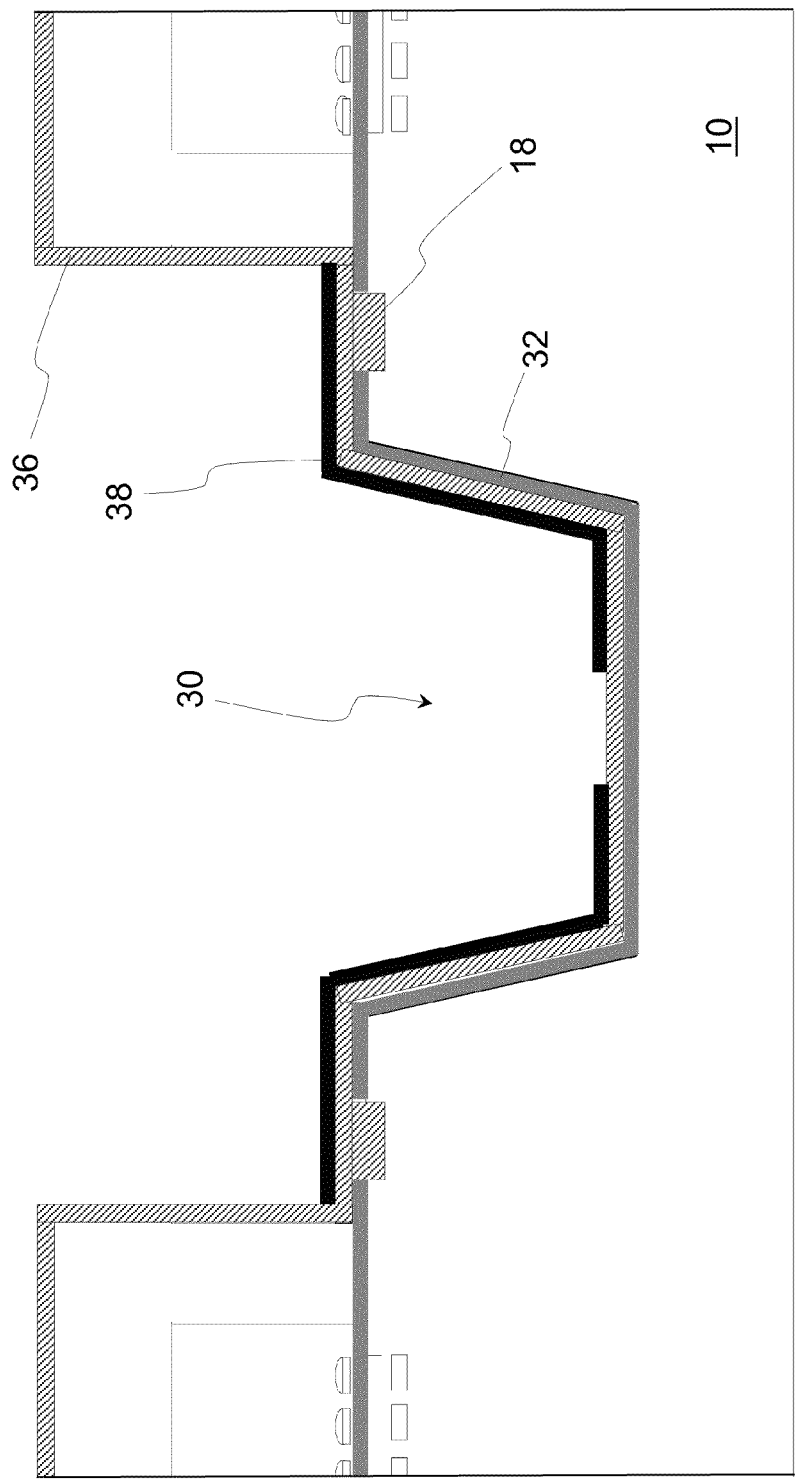
Figure 1G:
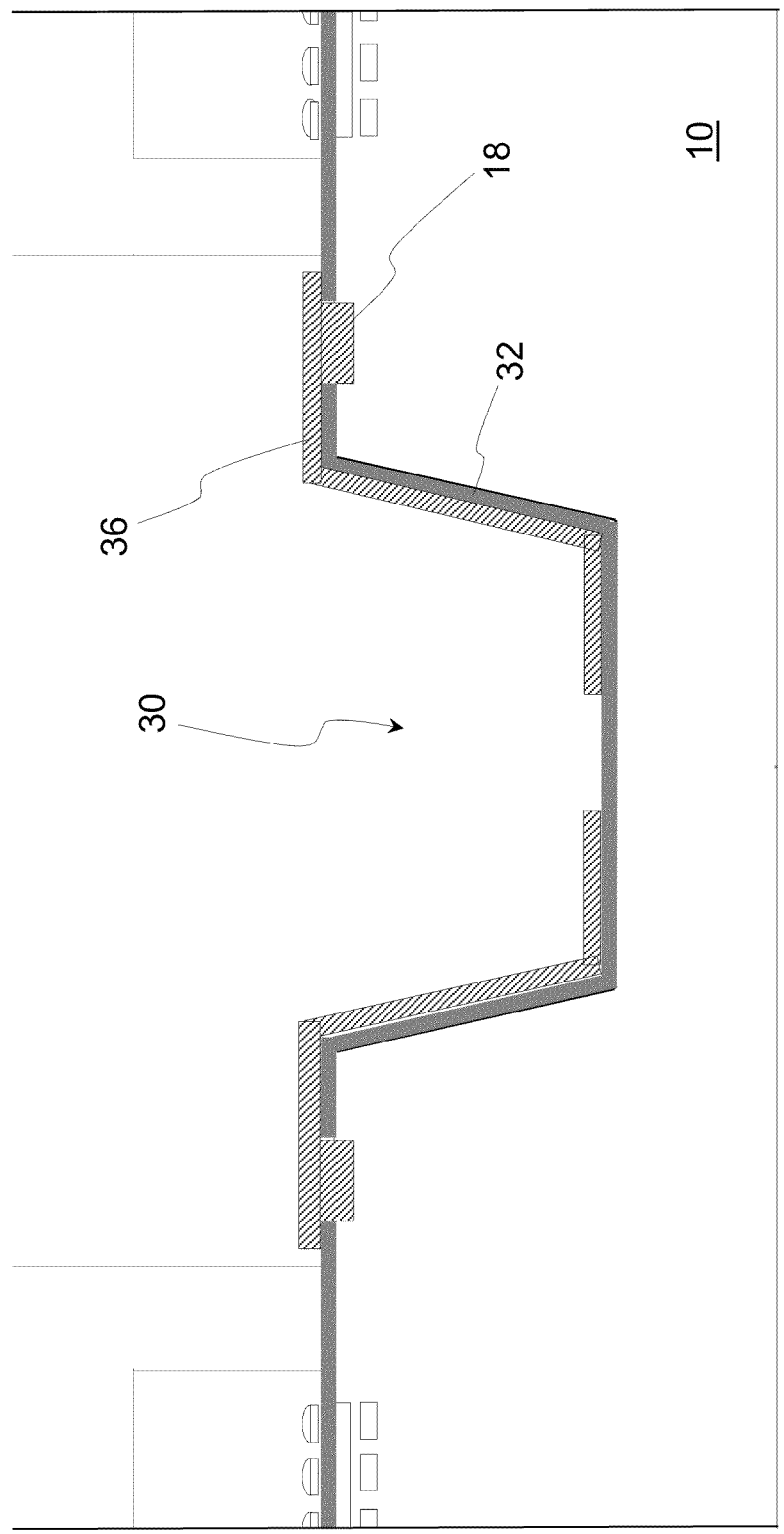

The photoresist 34 is stripped (e.g. using an oxygen plasma process or acetone chemical or any other photoresist stripping method that are well known in the art). An electrically conductive layer 36 is deposited on the structure. The electrically conductive layer 36 can be copper, aluminum, a conductive polymer or any other appropriate electric conductive material(s), and can be deposited by physical vapor deposition PVD, chemical vapor deposition, plating or any other appropriate deposition method(s). Preferably, the electrically conductive layer 36 is aluminum and is deposited by PVD. A layer of photoresist 38 is deposited over the structure, and exposed and etched using appropriate photolithography processes that are well known in the art to remove the photo resist 38 on the protective substrate 24 and a center portion at the bottom of trenches 30. The resulting structure is shown in FIG. 1F.

Wet or dry etching is performed to remove the exposed portions of conductive layer 36, leaving a plurality of discrete traces of the conductive layer 36 which form leads each extending from one of the contact pads 18, along the sidewall of the trench 30, and to the bottom of the trench 30. Etchant for wet etch can be phosphoric acid (H3PO4), acetic acid, nitric acid (HNO3) or any other appropriate etchant(s). Etchant for dry etch can be Cl2, CCl4, SiCl4, BCl3 or any other appropriate etchant(s). A wet etch is preferred method for lead formation. The photo resist 38 is then removed, resulting in the structure shown in FIG. 1G. An optional plating process (e.g. Ni/Pd/Au) can be performed on leads 36. It should be noted that, alternately, the photo resist 38 can optionally be left on the sidewalls of protective substrate 24, where the conductive layer 36 can remain on the sidewall of protective substrate 24 in which case it can act as a light shielding layer as well.

Figure 1H:
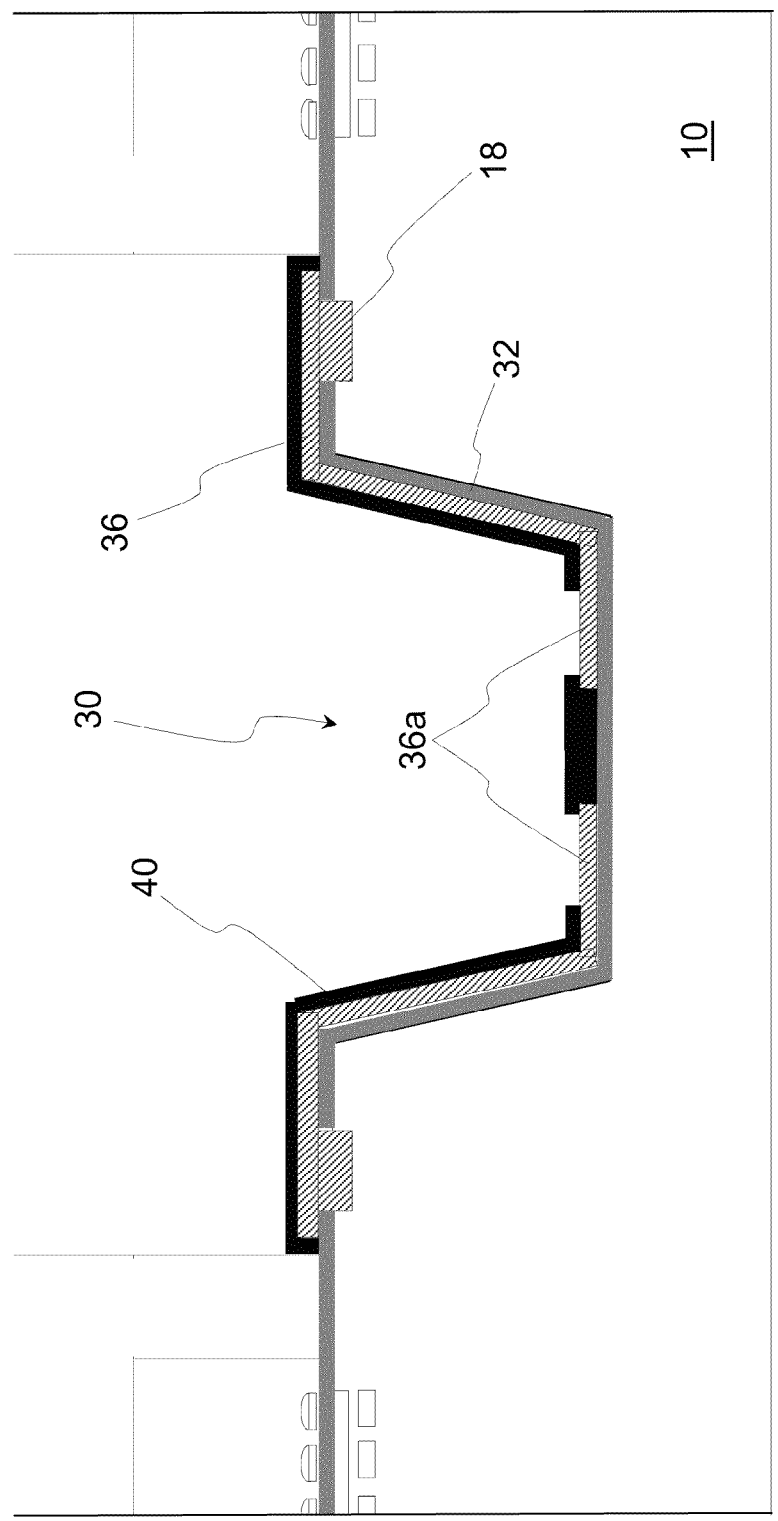

An optional encapsulant layer 40 is deposited over the structure. The encapsulant layer 40 can be polyimide, ceramics, polymer, polymer composite, parylene, silicon dioxide, epoxy, silicone, porcelain, nitrides, glass, ionic crystals, resin, a combination of aforementioned materials, or any other appropriate dielectric material(s). Encapsulant layer 40 is preferably 0.5 to 20 μm in thickness, and the preferred material is liquid photolithography polymer such as solder mask which can be deposited by spray coating. The photo-imagable encapsulation layer 40 is developed and selectively removed from the protective substrate 24 and contact portions 36a of leads 36. If desired, the encapsulating material 40 can optionally remain on the sidewall of protective substrate 24 to serve as a light shielding layer. The resulting structure is shown in FIG. 1H.

Figure 1I:
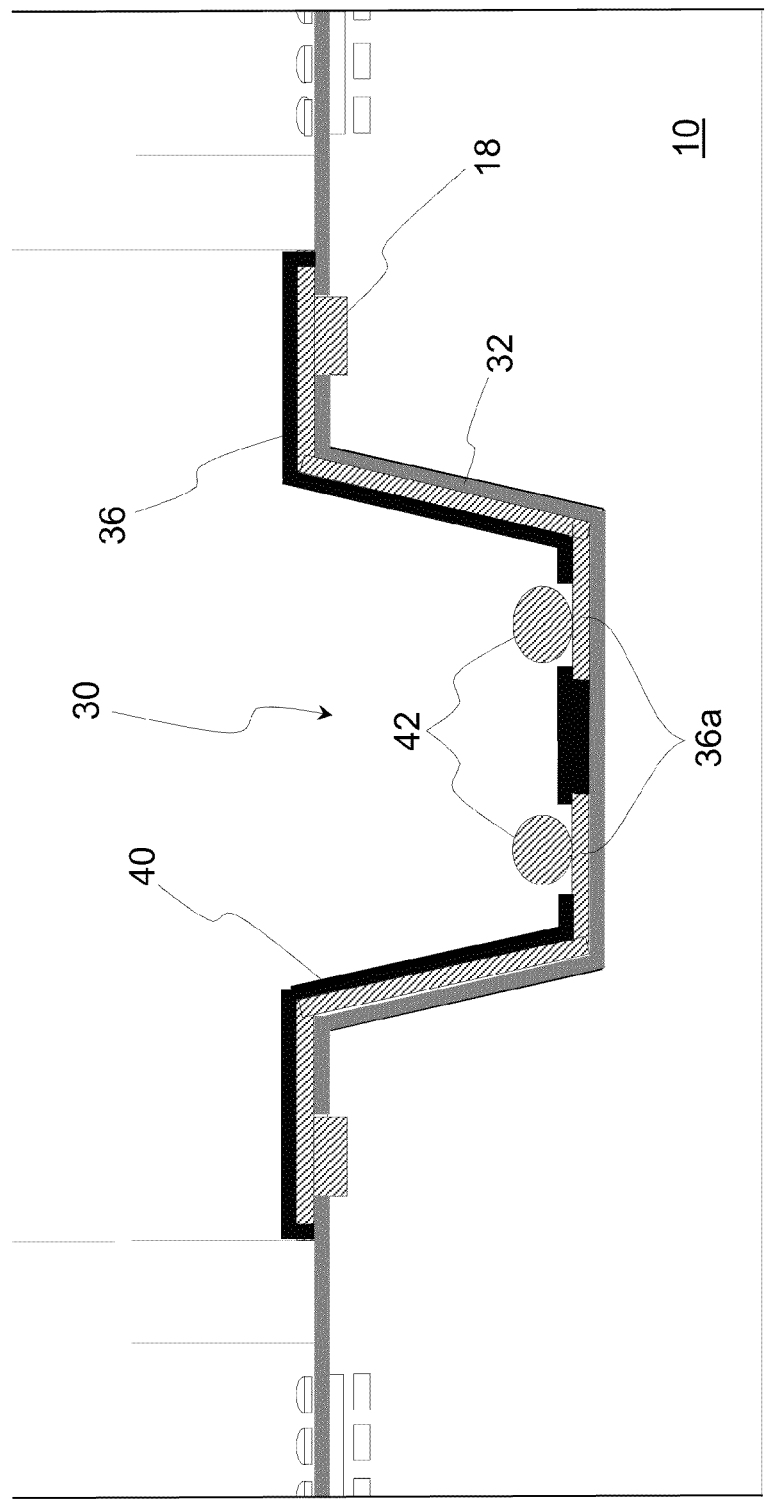

Interconnects 42 can be formed on the contact portions 36a. Alternately, interconnects 42 can be formed on a host substrate or other member that will make contact with contact portions 36a. Interconnects 42 can be BGA, stud bump, plated bump, adhesive bump, polymer bump, copper pillar, micro-post or any other appropriate interconnecting method(s). Preferably, interconnect 42 is made with adhesive bump that is a composite of conductive material(s) and adhesive material(s). The conductive material(s) can be silver, copper, aluminum, gold, graphite, a combination of aforementioned materials, or any other appropriate conductive material(s). The adhesive material(s) can be varnish, resin, a combination of aforementioned materials, or any other appropriate adhesive material(s). Preferably, the conductive adhesive is deposited on the contact portion 36a by a pneumatic dispensing gun or any other appropriate dispensing method(s) and then cured by heat, UV or any other appropriate curing method(s) thus forming the bumps 42. At the time of mounting, an additional layer of conductive adhesive can be dispensed on to the bumps 42 or on to the host substrate's contact pads. The resulting structure is shown in FIG. 1I.

Figure 1J:
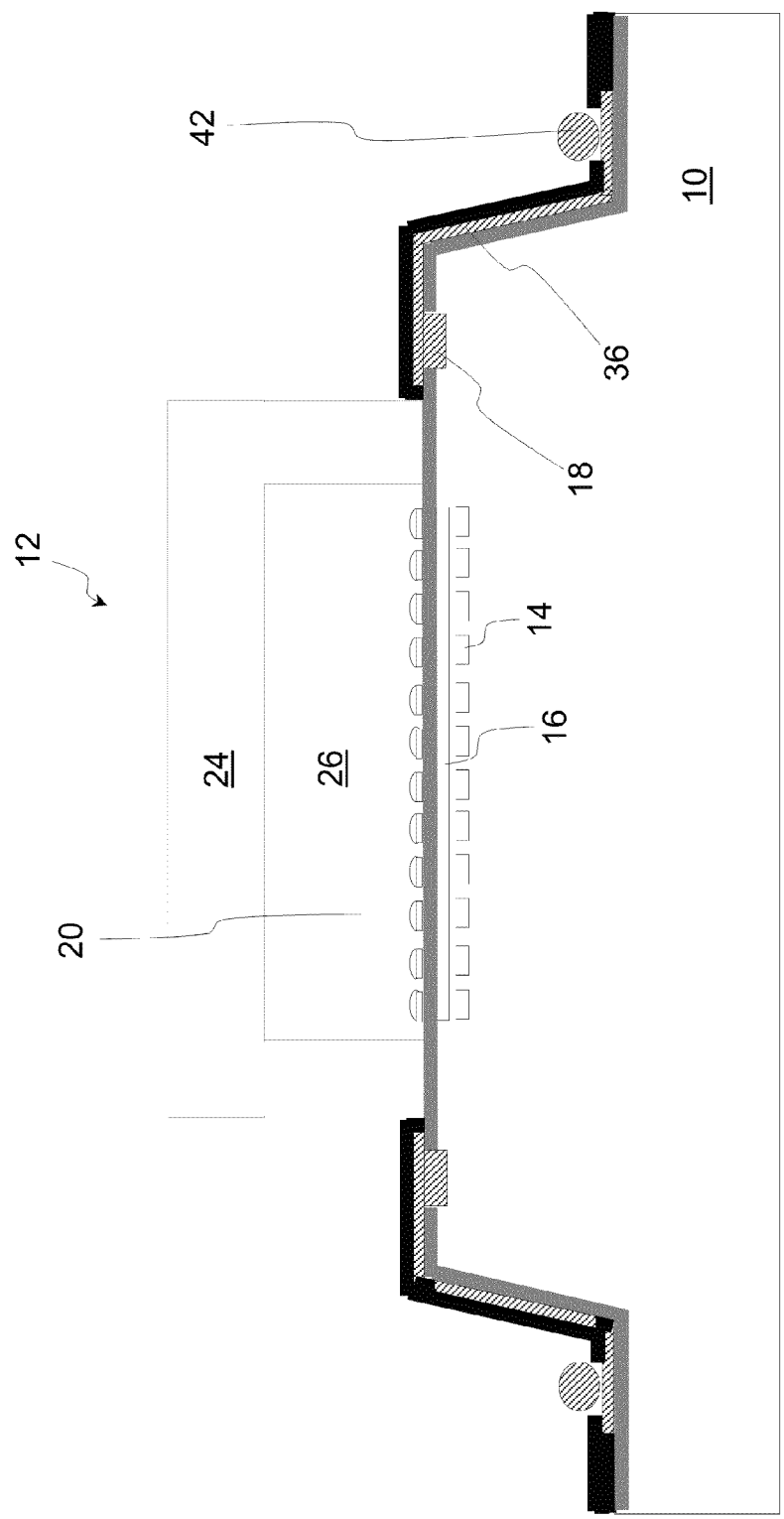
Figure 1K:
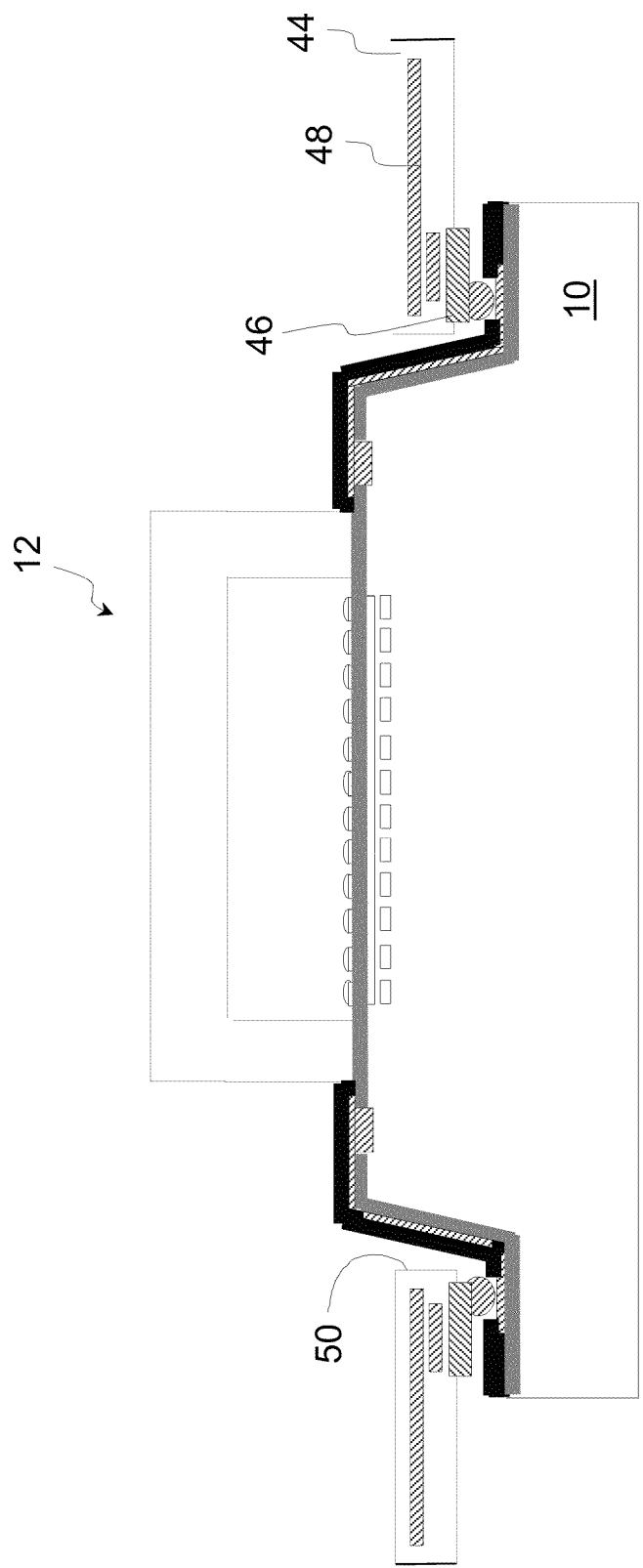

The substrate 10 is then singulated into multiple die along a scribe line running through the trenches, result in the structure in FIG. 1J. Wafer level dicing/singulation of components can be done with mechanical blade dicing equipment, laser cutting or any other appropriate processes. The singulated packaged sensor die can then be mounted via interconnects 42 to a host substrate 44 having contact pads 46, circuitry layers 48 and an aperture 50 through which the sensor die protrudes, as shown in FIG. 1K. The host substrate 44 can be organic flex PCB, silicon (rigid), glass, ceramic or any other type of substrates that are applicable. The thickness of host substrate 44 is preferably small enough that the upper surface of host substrate 44 is below the upper surface of substrate 10. Mounting can be facilitated by using a layer of conductive adhesive deposited by screen printing on the host substrate's contact pads 46, followed by a curing process.

Figure 1L:
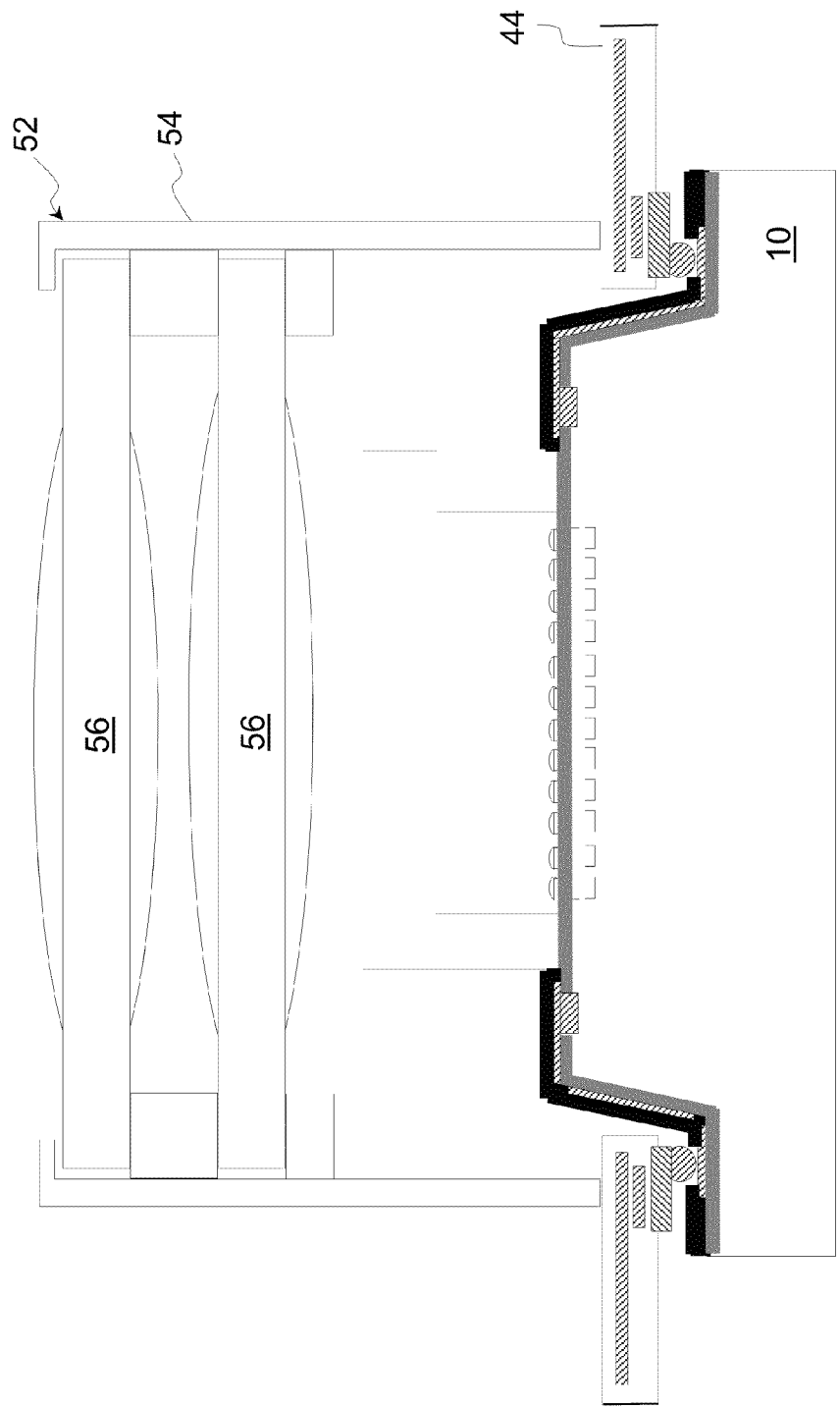

A lens module 52 may be mounted over the sensor 12, as illustrated in FIG. 1L. An exemplary lens module 52 can include a housing 54 bonded to the host substrate 44, where the housing supports one or more lenses over the sensor 12. Trench 30 could be an annular, open sided trench whereby its bottom surface is a continuous annular shoulder, in which case aperture 50 could mimic the shape of trench 30. Alternately, there could be a plurality of discrete, open sided trenches 30 whereby each trench bottom surface forms a discrete shoulder, in which case aperture 50 would have a shape to accommodate such a trench configuration.

Figure 2A:
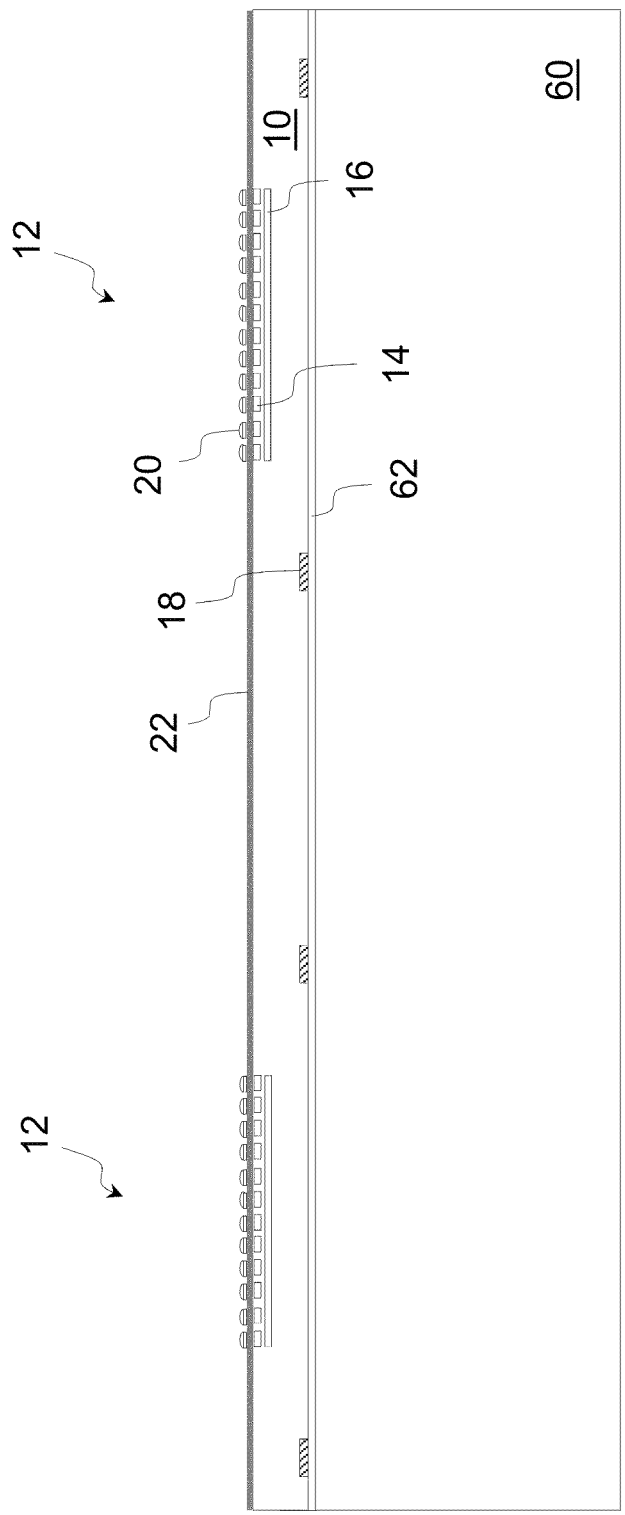
Figure 2B:
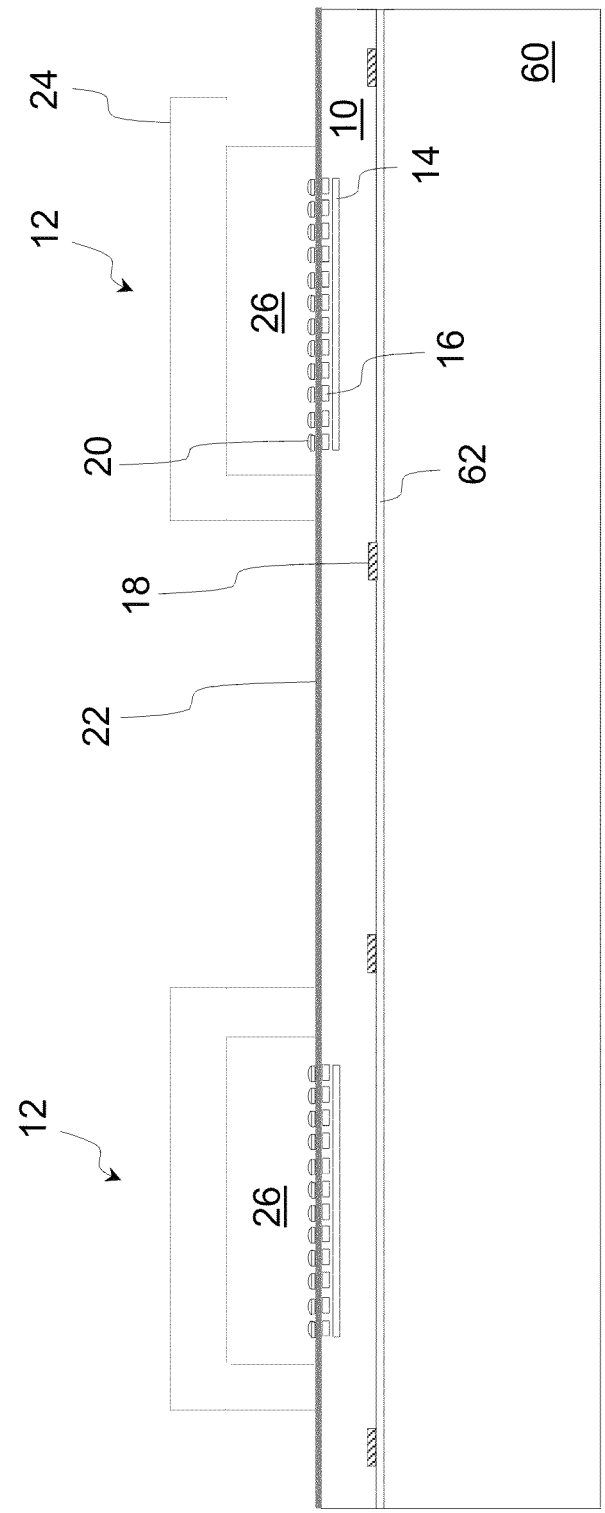

FIGS. 2A-2H illustrate the formation of an alternate embodiment of the packaged image sensor. The formation begins with the same structure as illustrated in FIG. 1A, except the contact pads 18 are located on the opposite surface of the substrate 10 on which light is incident. This configuration could include back side illuminated sensor devices (BSI) where the photo detectors 14 are formed adjacent the opposite surface of the substrate as the contact pads 18 or the photo detectors are configured to detect light entering the substrate 10 through that surface. The substrate 10 is mounted to a support substrate 60 using an appropriate adhesive 62, as shown in FIG. 2A. The sensors are then encapsulated by protective substrate 24, and the support substrate 60 thinned, by the same techniques described above with respect to FIGS. 1B and 1C, to result in the structure shown in FIG. 2B.

Figure 2C:
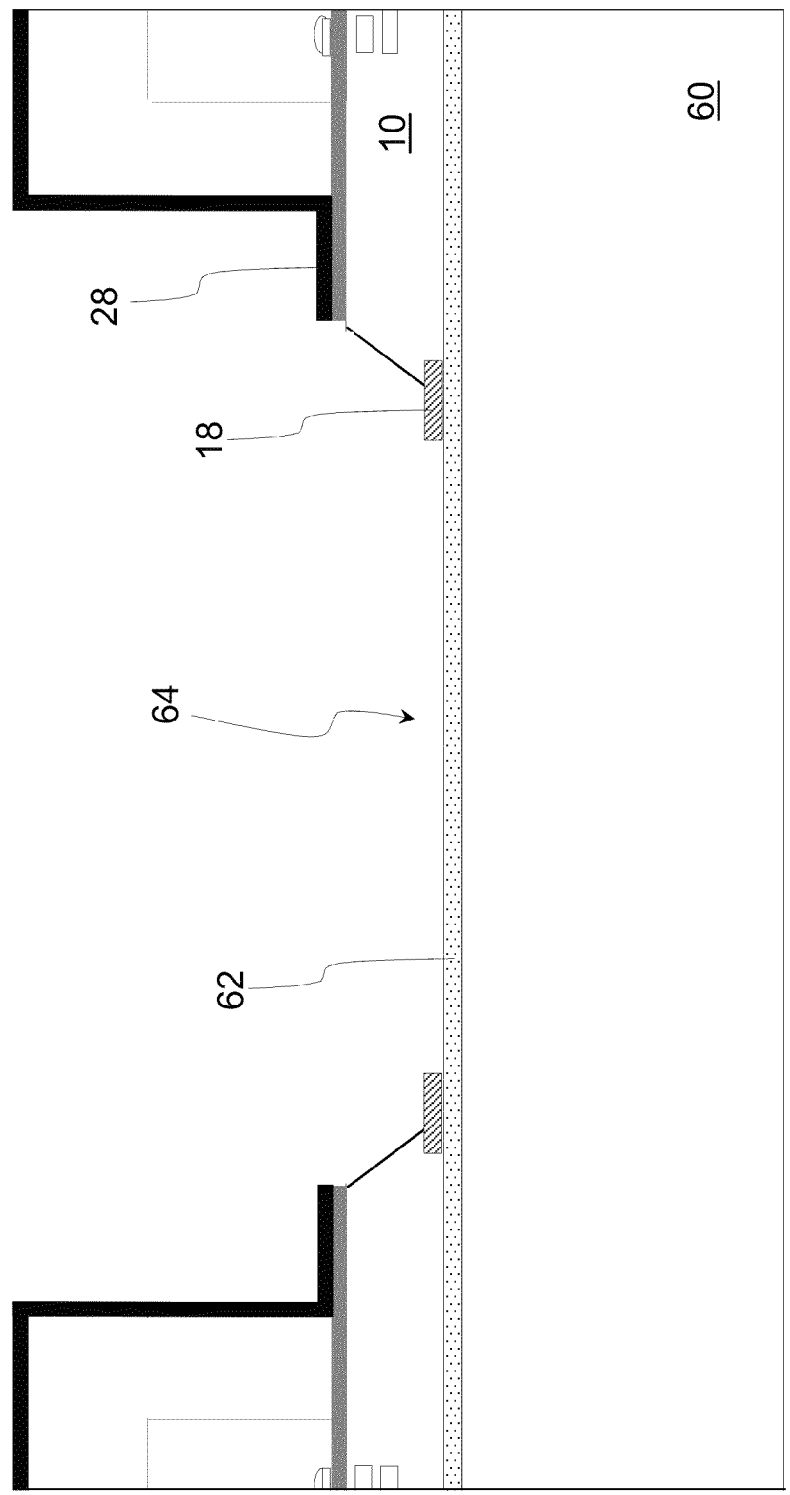
Figure 2D:
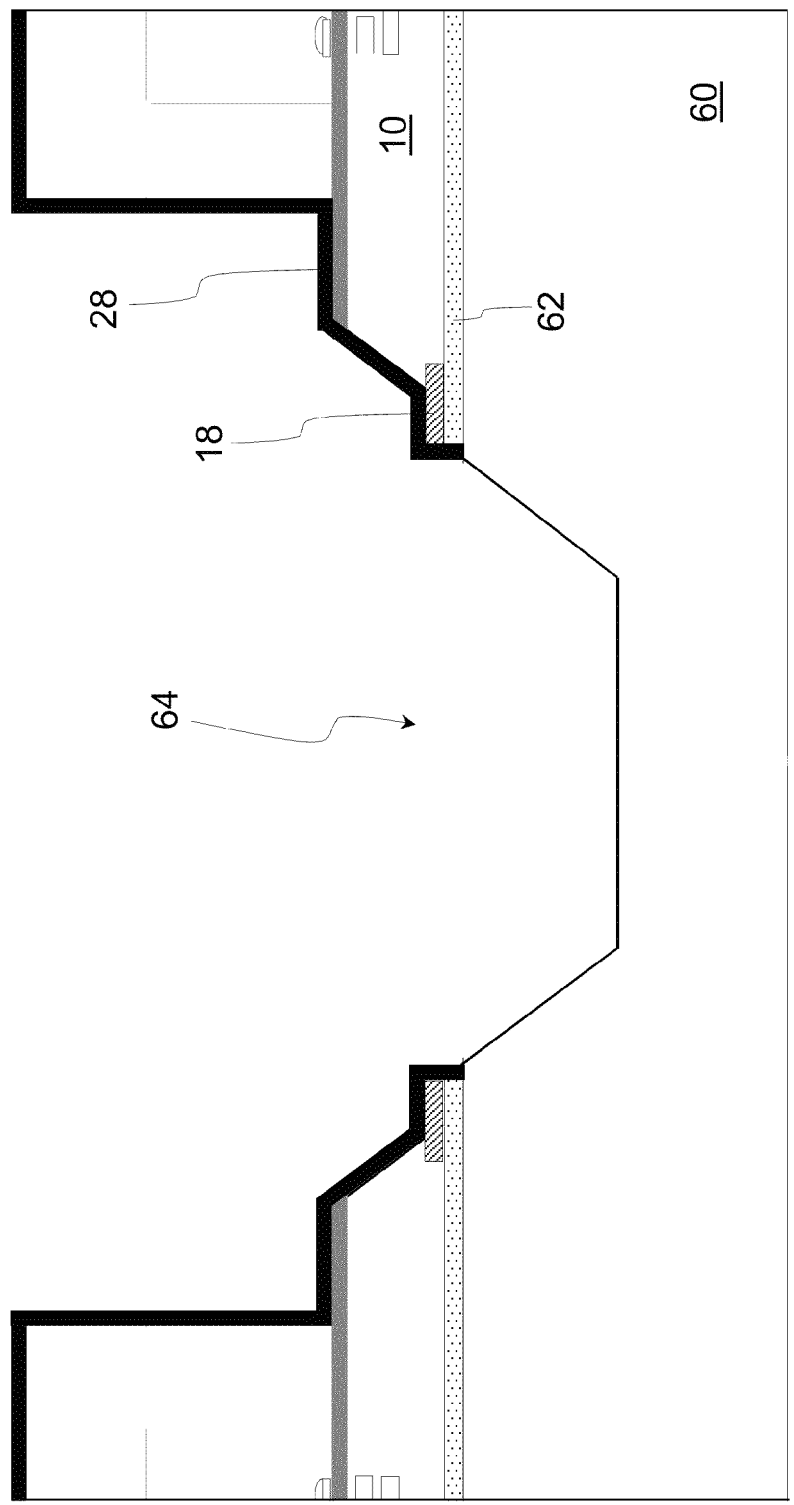

The structure is processed to form trenches 64 into the substrate 10 as described above with respect to FIG. 1D except that trenches 64 extend all the way through substrate 10 to expose the adhesive 62 and to partially expose contact pads 18, as illustrated in FIG. 2C. The exposed adhesive 62 is then removed, for example by using a plasma etch process. The photo resist 28 is then removed. Photo resist 66 is applied over the structure, following by a photolithography etch to remove the photo resist 66 on (and expose) substrate 60 at the bottom of trench 64. A silicon etch is then performed to etch the exposed portion of substrate 60 to extend trench 64 into the substrate 60, as shown in FIG. 2D.

Figure 2E:
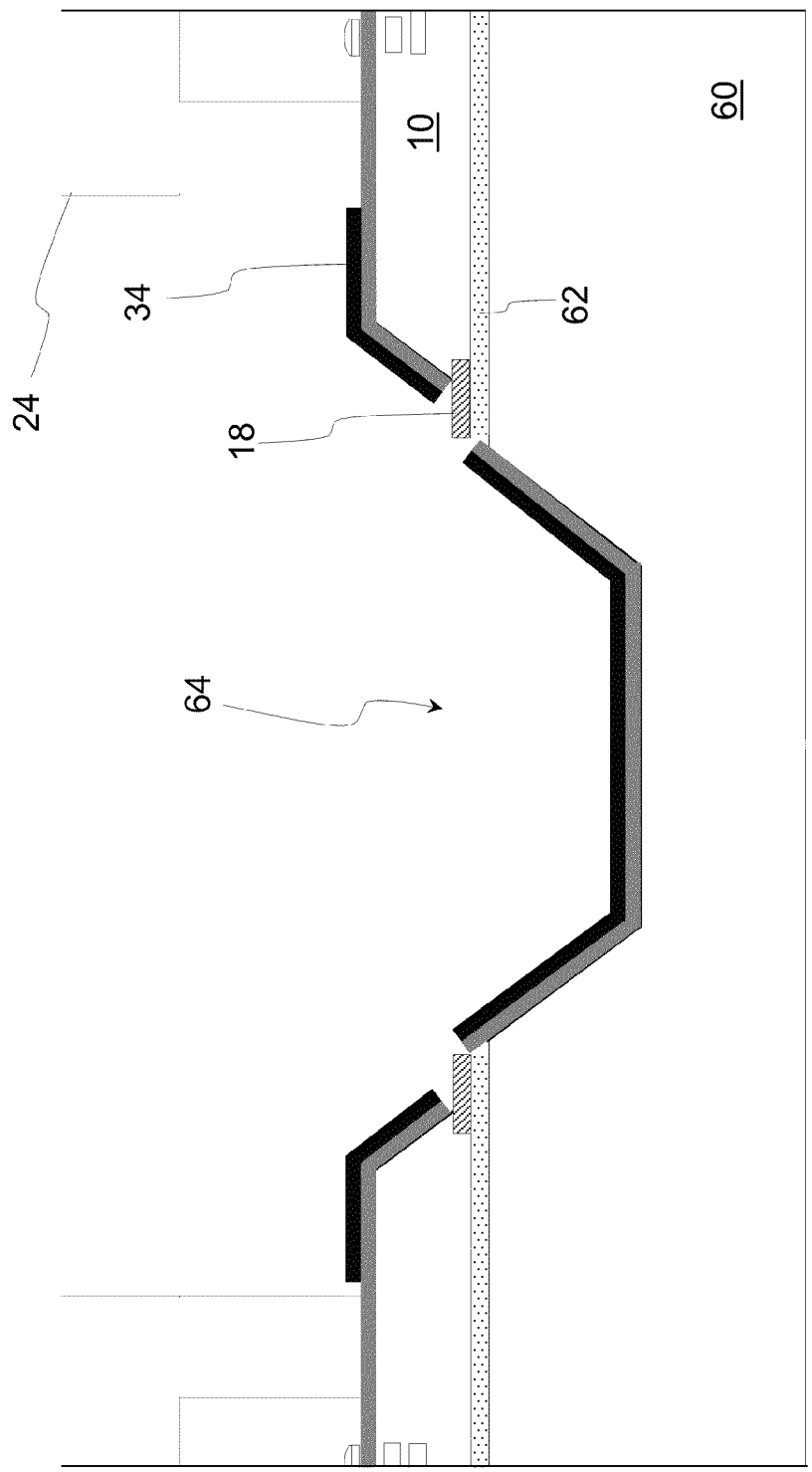

Photo resist 66 is removed, and the passivation layer 32 is formed in trench 64 as discussed above with respect to FIG. 1E, as shown in FIG. 2E. Photo resist 34 is removed, and conductive traces/leads 36 are formed extending from contact pads 18 down into trenches 64 as discussed above with respect to FIGS. 1F and 1G, as shown in FIG. 2F. For this embodiment, the traces/leads extend along the lower sidewalls of trenches 64 defined by substrate 60, and not along the upper sidewalls of trenches 64 defined by substrate 10.

Figure 2H:
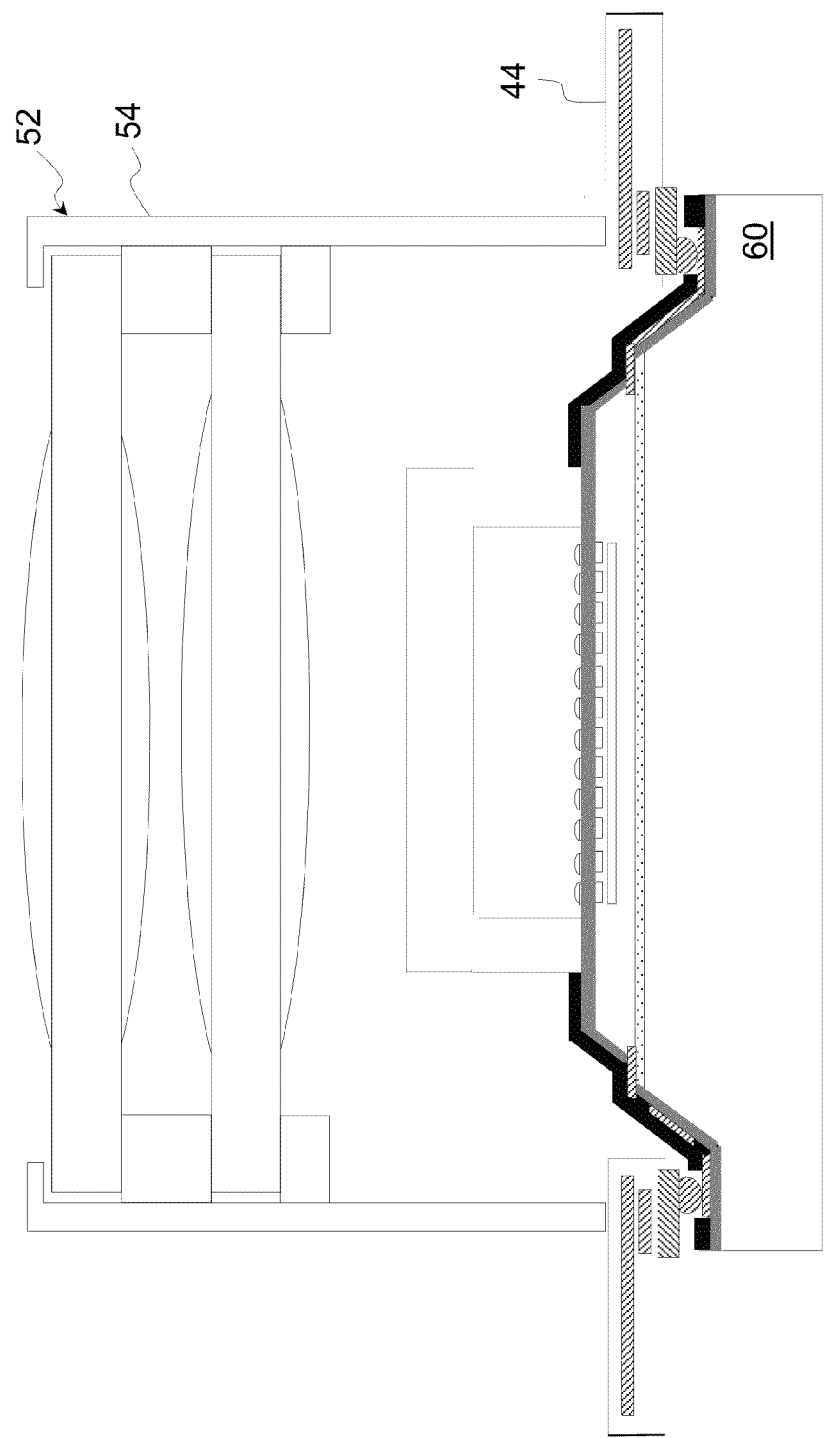

Encapsulant 40 and interconnects 42 are formed as disclosed above with respect to FIGS. 1H and 1I, as shown in FIG. 2G. The substrate 10 is then singulated, mounted to a host substrate 44, and fitted with a lens module 52 as described above with respect to FIGS. 1J-1L, as shown in FIG. 2H.

Figure 3A:
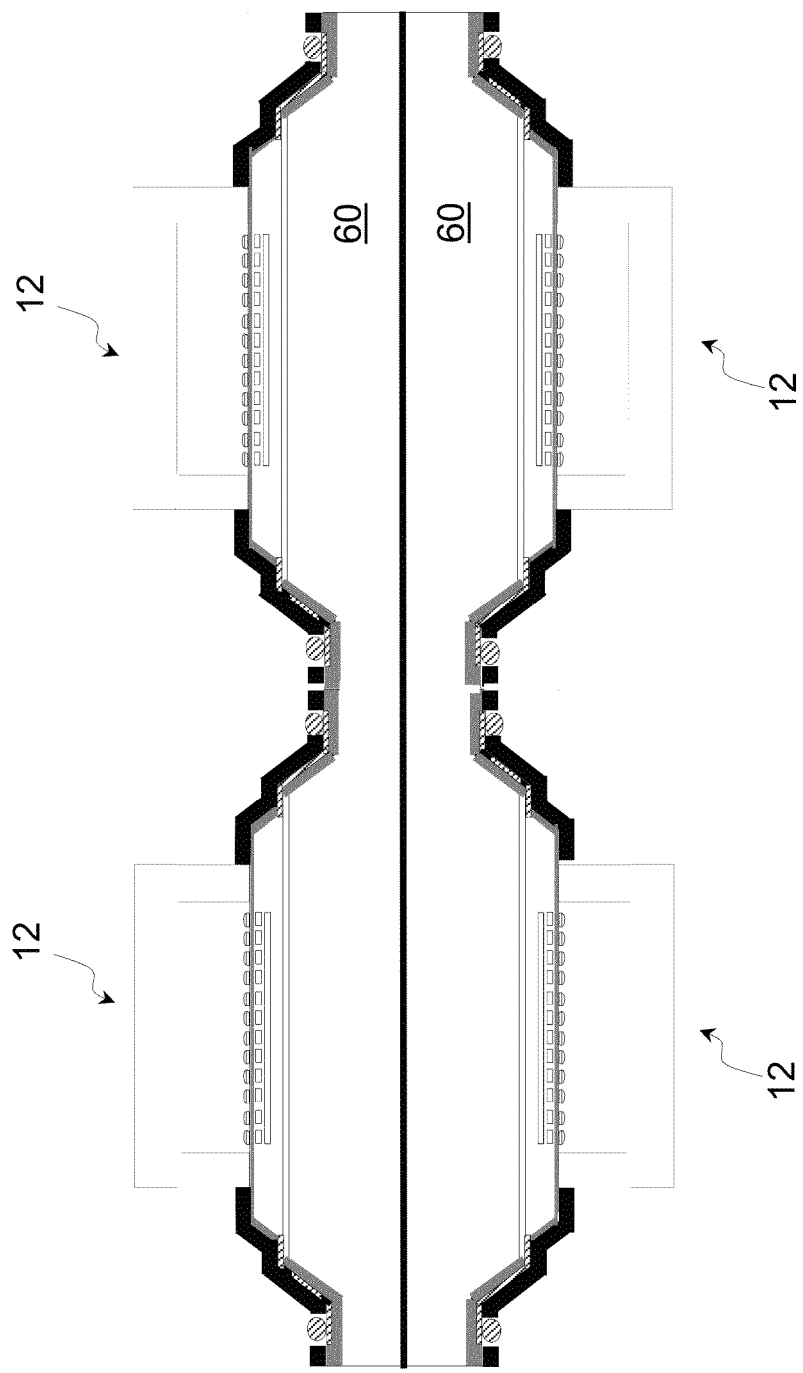
FIGS. 3A-3C are cross sectional side views showing in sequence the steps in forming a second alternate embodiment of the image sensor assembly.
Figure 3B:
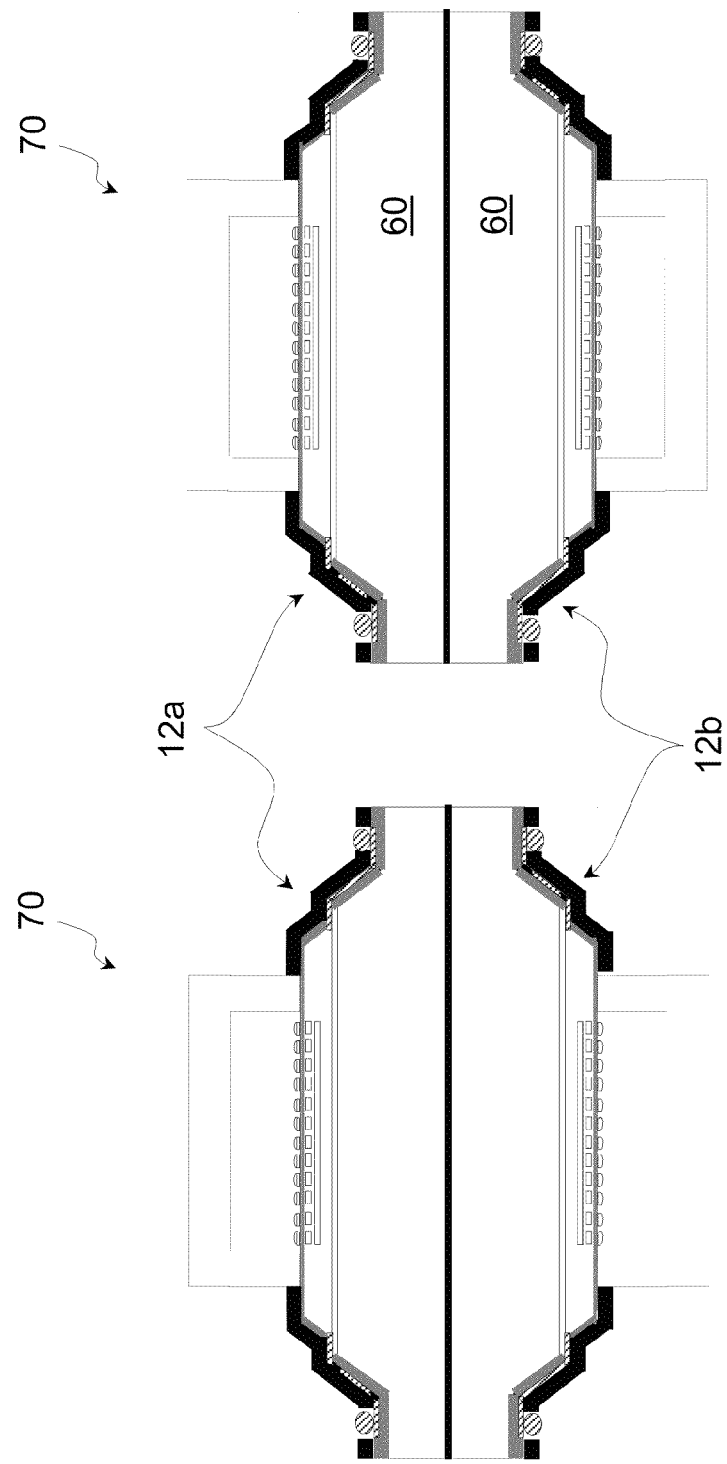
Figure 3C:
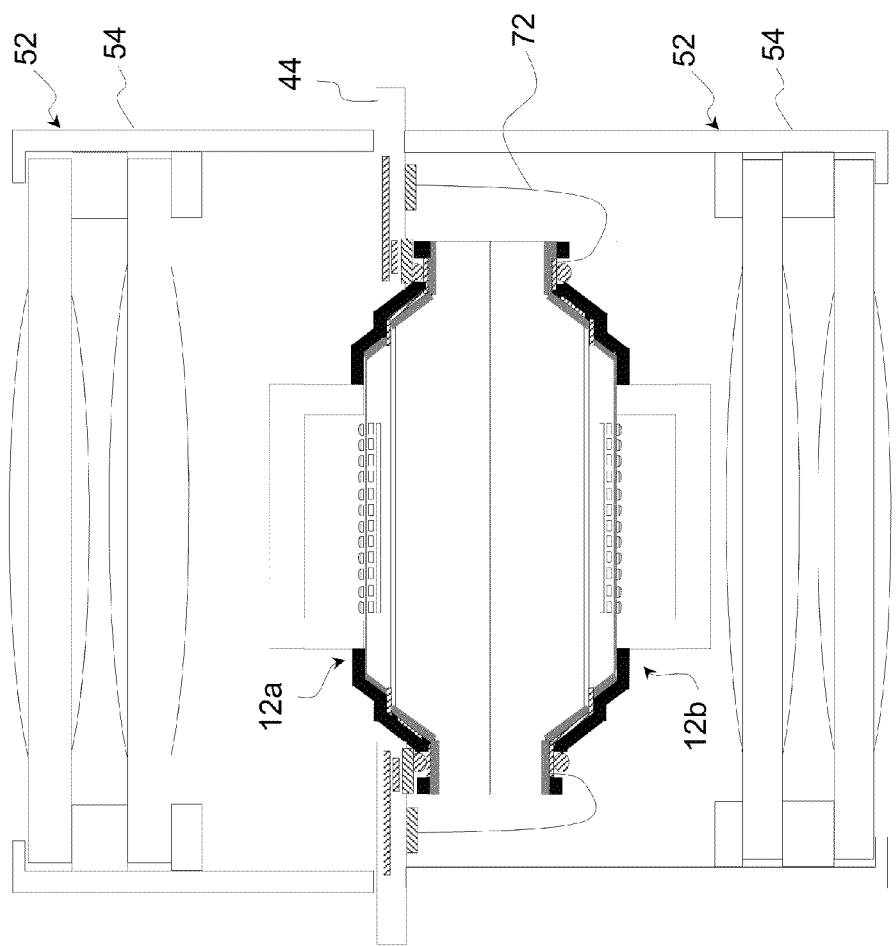

FIGS. 3A-3C illustrate the formation of a second alternate embodiment of the packaged image sensor. The formation begins with the structure of FIG. 2G (before singulation). Two such structures are attached to each other back to back, as illustrated in FIG. 3A, preferably using adhesive. The back to back substrates 60 are then singulated into individual modules 70 each having an upper sensor 12a and a lower sensor 12b oriented back to back, as shown in FIG. 3B. The upper sensor 12a is mounted to a host substrate 44, and fitted with a lens module 52 as described above with respect to FIGS. 1J-1L, as shown in FIG. 3C. The lower sensor 12b is electrically connected to contact pads 46 of host substrate by wire bonding 72. Wire bonding 72 can connect to interconnects 42 or directly to contact pads 18 of lower sensor 12b.

Figure 4:
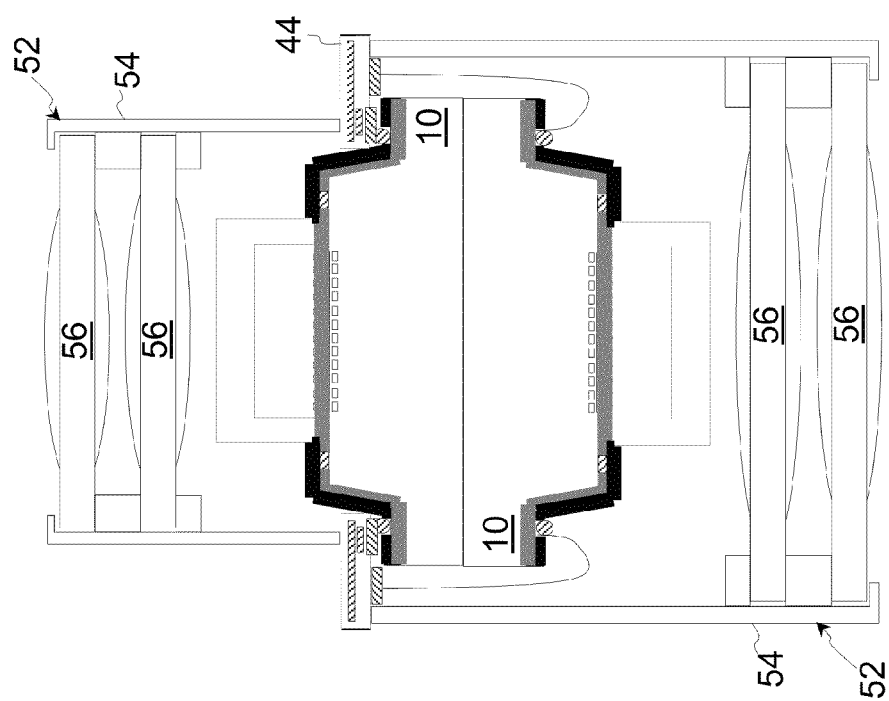
FIG. 4 is a cross sectional side view showing a third alternate embodiment of the image sensor assembly.

A similar process of forming back to back sensors as discussed above with respect to FIGS. 3A-3C can similarly be applied to the embodiment of FIGS. 1A-1L, as illustrated in FIG. 4.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the image sensor. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. An image sensor package, comprising:
a host substrate assembly including:
  a first substrate with opposing first and second surfaces,
  an aperture extending through the first substrate between the first and second surfaces,
  one or more circuit layers,
  a plurality of first contact pads electrically coupled to the one or more circuit layers;
a sensor chip mounted to the host substrate assembly and disposed at least partially in the aperture, wherein the sensor chip includes:
  a second substrate with opposing first and second surfaces,
  a plurality of photo detectors formed on or in the second substrate,
  a plurality of second contact pads formed at the first surface of the second substrate which are electrically coupled to the photo detectors,
  one or more trenches formed into the first surface of the second substrate,
  a plurality of conductive traces each extending from one of the second contact pads and into the one or more trenches, and
  a third substrate having a first surface mounted to the first surface of the second substrate, wherein the third substrate includes a cavity formed into the first surface of the third substrate that is positioned over the photo detectors;
electrical connectors each electrically connecting one of the first contact pads and one of the plurality of conductive traces; and
a lens module mounted to the host substrate assembly, wherein the lens module includes one or more lenses disposed for focusing light through the third substrate and onto the photo detectors.

2. The image sensor package of claim 1, wherein the electrical connectors are conductive bumps that each electrically connect one of the first contact pads to one of the plurality of conductive traces.

3. The image sensor package of claim 1, wherein the one or more trenches is a plurality of open sided trenches that include bottom surfaces shaped as discrete shoulders.

4. An image sensor package, comprising:
a host substrate assembly including:
  a first substrate with opposing first and second surfaces,
  an aperture extending through the first substrate between the first and second surfaces,
  one or more circuit layers,
  a plurality of first contact pads electrically coupled to the one or more circuit layers;
a sensor chip mounted to the host substrate assembly and disposed at least partially in the aperture, wherein the sensor chip includes:
  a second substrate with opposing first and second surfaces,
  a plurality of photo detectors formed on or in the second substrate,
  a plurality of second contact pads formed at the first surface of the second substrate which are electrically coupled to the photo detectors,
  one or more trenches formed into the first surface of the second substrate,
  a plurality of conductive traces each extending from one of the second contact pads and into the one or more trenches, and
  a third substrate having a first surface mounted to the first surface of the second substrate, wherein the third substrate includes a cavity formed into the first surface of the third substrate that is positioned over the photo detectors;
electrical connectors each electrically connecting one of the first contact pads and one of the plurality of conductive traces; and
a lens module mounted to the host substrate assembly, wherein the lens module includes one or more lenses disposed for focusing light through the third substrate and onto the photo detectors;
wherein the one or more trenches is a single open sided trench that includes a bottom surface shaped as an annular shoulder.

5. An image sensor package, comprising:
a host substrate assembly including:
  a first substrate with opposing first and second surfaces,
  an aperture extending through the first substrate between the first and second surfaces,
  one or more circuit layers,
  a plurality of first contact pads electrically coupled to the one or more circuit layers;
a sensor chip mounted to the host substrate assembly and disposed at least partially in the aperture, wherein the sensor chip includes:
  a second substrate with opposing first and second surfaces,
  a plurality of photo detectors formed on or in the second substrate,
  a plurality of second contact pads formed at the first surface of the second substrate which are electrically coupled to the photo detectors,
  one or more trenches formed into the first surface of the second substrate,
  a plurality of conductive traces each extending from one of the second contact pads and into the one or more trenches, and
  a third substrate having a first surface mounted to the first surface of the second substrate, wherein the third substrate includes a cavity formed into the first surface of the third substrate that is positioned over the photo detectors;
electrical connectors each electrically connecting one of the first contact pads and one of the plurality of conductive traces;
a lens module mounted to the host substrate assembly, wherein the lens module includes one or more lenses disposed for focusing light through the third substrate and onto the photo detectors;

a second sensor chip that includes:
a fourth substrate with opposing first and second surfaces,
a plurality of second photo detectors formed on or in the fourth substrate,
a plurality of third contact pads formed at the first surface of the fourth substrate which are electrically coupled to the second photo detectors,
one or more trenches formed into the first surface of the fourth substrate,
a fifth substrate having a first surface mounted to the first surface of the fourth substrate, wherein the fifth substrate includes a cavity formed into the first surface of the fifth substrate that is positioned over the second photo detectors, and
a plurality of second conductive traces each extending from one of the third contact pads and into the one or more trenches of the fourth substrate;
wherein the first substrate further comprises fourth contact pads coupled to the one or more circuit layers;
second electrical connectors each electrically connecting one of the fourth contact pads and one of the plurality of second conductive traces; and
a second lens module mounted to the host substrate assembly, wherein the second lens module includes one or more lenses disposed for focusing light through the fifth substrate and onto the second photo detectors;
wherein the second surface of the fourth substrate is mounted to the second surface of the second substrate.

6. The image sensor package of claim 5, wherein the second electrical connectors are wire bonds.

7. The image sensor package of claim 5, wherein each of the second and fourth substrates are semiconductor substrates.

8. An image sensor package, comprising:
a host substrate assembly including:
a first substrate with opposing first and second surfaces,
an aperture extending through the first substrate between the first and second surfaces,
one or more circuit layers,
a plurality of first contact pads electrically coupled to the one or more circuit layers;
a sensor chip mounted to the host substrate assembly and disposed at least partially in the aperture, wherein the sensor chip includes:
a second substrate with opposing first and second surfaces,
a plurality of photo detectors formed on or in the second substrate,
a plurality of second contact pads formed at the second surface of the second substrate which are electrically coupled to the photo detectors,
one or more trenches formed into the first surface of the second substrate and exposing the second contact pads, and
a third substrate having a first surface mounted to the first surface of the second substrate, wherein the third substrate includes a cavity formed into the first surface of the third substrate that is positioned over the photo detectors;
a fourth substrate with opposing first and second surfaces, wherein the first surface of the fourth substrate is mounted to the second surface of the second substrate, and wherein the fourth substrate includes one or more trenches formed into the first surface of the fourth substrate;
a plurality of conductive traces each extending from one of the second contact pads and into the one or more trenches of the fourth substrate;
electrical connectors each electrically connecting one of the first contact pads and one of the plurality of conductive traces; and
a lens module mounted to the host substrate assembly, wherein the lens module includes one or more lenses disposed for focusing light through the third substrate and onto the photo detectors.

9. The image sensor package of claim 8, wherein the electrical connectors are conductive bumps that each electrically connect one of the first contact pads to one of the plurality of conductive traces.

10. The image sensor package of claim 8, wherein the one or more trenches of the fourth substrate is a single open sided trench that includes a bottom surface shaped as an annular shoulder.

11. The image sensor package of claim 8, wherein the one or more trenches of the fourth substrate is a plurality of open sided trenches that include bottom surfaces shaped as discrete shoulders.

12. The image sensor package of claim 8, further comprising:
a second sensor chip that includes:
a fifth substrate with opposing first and second surfaces,
a plurality of second photo detectors formed on or in the fifth substrate,
a plurality of third contact pads formed at the second surface of the fifth substrate which are electrically coupled to the second photo detectors,
one or more trenches formed into the first surface of the fifth substrate and exposing the third contact pads, and
a sixth substrate having a first surface mounted to the first surface of the fifth substrate, wherein the sixth substrate includes a cavity formed into the first surface of the sixth substrate that is positioned over the second photo detectors;
a seventh substrate having opposing first and second surfaces, wherein the first surface of the seventh substrate is mounted to the second surface of the fifth substrate, and wherein the seventh substrate includes one or more trenches formed into the first surface of the seventh substrate;
a plurality of second conductive traces each extending from one of the third contact pads and into the one or more trenches of the seventh substrate;
wherein the first substrate further comprises fourth contact pads coupled to the one or more circuit layers;
second electrical connectors each electrically connecting one of the fourth contact pads and one of the plurality of second conductive traces; and
a second lens module mounted to the host substrate assembly, wherein the second lens module includes one or more lenses disposed for focusing light through the sixth substrate and onto the second photo detectors;
wherein the second surface of the fourth substrate is mounted to the second surface of the seventh substrate.

13. The image sensor package of claim 12, wherein the second electrical connectors are wire bonds.

14. The image sensor package of claim 12, wherein each of the second, fourth, fifth and seventh substrates are semiconductor substrates.

* * * * *